United States Patent
Yamada et al.

(10) Patent No.: US 10,857,789 B2
(45) Date of Patent: Dec. 8, 2020

(54) PRINT HEAD, LIQUID EJECTION APPARATUS, AND PIEZOELECTRIC ELEMENT CONTROL CIRCUIT

(71) Applicant: Seiko Epson Corporation, Tokyo (JP)

(72) Inventors: Tomokazu Yamada, Shiojiri (JP); Motonori Chikamoto, Shiojiri (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/362,869

(22) Filed: Mar. 25, 2019

(65) Prior Publication Data
US 2019/0291423 A1    Sep. 26, 2019

(30) Foreign Application Priority Data
Mar. 26, 2018  (JP) ................. 2018-057648

(51) Int. Cl.
*B41J 2/045* (2006.01)
*B41J 2/14* (2006.01)
*H01L 41/187* (2006.01)

(52) U.S. Cl.
CPC ......... *B41J 2/04581* (2013.01); *B41J 2/0455* (2013.01); *B41J 2/04541* (2013.01); *B41J 2/04588* (2013.01); *B41J 2/14201* (2013.01); *H01L 41/187* (2013.01); *B41J 2002/14491* (2013.01)

(58) Field of Classification Search
CPC .. B41J 2/04581; B41J 2/0455; B41J 2/04541; B41J 2/04588; B41J 2/14201; B41J 2/14233; H01L 41/187
See application file for complete search history.

(56) References Cited

U.S. PATENT DOCUMENTS

| | | |
|---|---|---|
| 2002/0005871 A1 | 1/2002 | Horio et al. |
| 2002/0145637 A1 | 10/2002 | Umeda et al. |
| 2015/0054868 A1 | 2/2015 | Kashimura |
| 2016/0144616 A1 | 5/2016 | Yamada |
| 2016/0207340 A1* | 7/2016 | Takano et al. ....... B41J 2/04581 |
| 2016/0271938 A1 | 9/2016 | Abe |
| 2016/0351788 A1* | 12/2016 | Mizukami ............. H01L 41/187 |

(Continued)

FOREIGN PATENT DOCUMENTS

| | | |
|---|---|---|
| JP | 2002-264325 A | 9/2002 |
| JP | 2002-273874 A | 9/2002 |

(Continued)

*Primary Examiner* — Juanita D Jackson
(74) *Attorney, Agent, or Firm* — Harness, Dickey & Pierce, P.L.C.

(57) ABSTRACT

A print head includes a first piezoelectric element that includes a first electrode supplied with a drive signal and a second electrode supplied with a reference voltage signal and is displaced by a difference in electric potential between the first electrode and the second electrode, a cavity that is filled with a liquid ejected from a nozzle along with the displacement of the first piezoelectric element, a vibration plate that is disposed between the cavity and the first piezoelectric element, a first switch circuit that switches between supplying and not supplying the drive signal to the first electrode, and a second switch circuit that switches between electrically connecting and not electrically connecting the first electrode and the second electrode depending on an electric potential of the drive signal.

15 Claims, 13 Drawing Sheets

(56) References Cited

U.S. PATENT DOCUMENTS

| | | |
|---|---|---|
| 2017/0062697 A1 | 3/2017 | Sakai et al. |
| 2017/0120593 A1 | 5/2017 | Morikoshi et al. |
| 2017/0173948 A1 | 6/2017 | Fujisawa |
| 2017/0253034 A1 | 9/2017 | Tsukamoto |

FOREIGN PATENT DOCUMENTS

| | | |
|---|---|---|
| JP | 2002-283565 A | 10/2002 |
| JP | 2002-283567 A | 10/2002 |
| JP | 2003-072069 A | 3/2003 |
| JP | 2007-125732 A | 5/2007 |

* cited by examiner

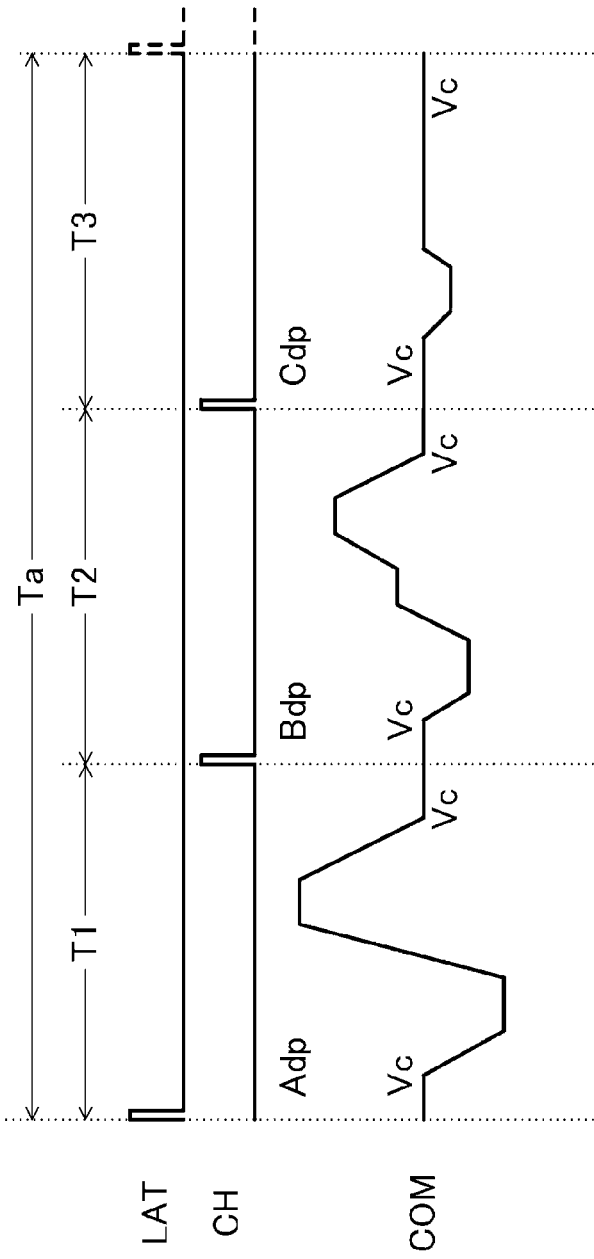

FIG. 9

| OPERATION MODE | | PRINTING MODE | | | | STANDBY MODE | SLEEP MODE |
|---|---|---|---|---|---|---|---|
| | | LARGE DOT | MEDIUM DOT | SMALL DOT | MICRO-VIBRATION | | |
| [SIH, SIL] | | [1, 1] | [1, 0] | [0, 1] | [0, 0] | – | – |
| [MCH, MCL] | | [1, 1] | | | | [1, 0] | [0, 0] |
| S | T1 | H | H | L | L | H | L |
| | T2 | H | L | H | L | | |
| | T3 | L | L | L | H | | |

PRINT HEAD, LIQUID EJECTION APPARATUS, AND PIEZOELECTRIC ELEMENT CONTROL CIRCUIT

This application claims priority to Japanese Patent Application No. 2018-057648 filed on Mar. 26, 2018. The entire disclosure of Japanese Patent Application No. 2018-057648 is hereby incorporated herein by reference.

BACKGROUND

1. Technical Field

The present invention relates to a print head, a liquid ejection apparatus, and a piezoelectric element control circuit.

2. Related Art

In an ink jet printer (liquid ejection apparatus) that prints an image or a document by ejecting a liquid such as ink, it is known that a piezoelectric element such as a piezo element is used as a drive element. The piezoelectric element is disposed in a print head in correspondence with a plurality of nozzles ejecting ink and a cavity retaining ink ejected from the nozzle. By displacing the piezoelectric element in accordance with a drive signal, a vibration plate disposed between the piezoelectric element and the cavity is bent, and the capacity of the cavity is changed. Accordingly, a predetermined amount of ink is ejected from the nozzle at a predetermined timing, and a dot is formed on a medium.

JP-A-2002-273874, JP-A-2002-283567, JP-A-2002-283565, JP-A-2002-264325, JP-A-2003-072069, and JP-A-2007-125732 disclose a liquid ejection apparatus that controls displacement of a piezoelectric element and ejects ink corresponding to the displacement of the piezoelectric element by controlling whether or not to cause a selection circuit (switch circuit) to supply a drive signal to the piezoelectric element which is displaced based on a difference in electric potential between an upper electrode and a lower electrode. Specifically, JP-A-2002-273874, JP-A-2002-283567, JP-A-2002-283565, JP-A-2002-264325, JP-A-2003-072069, and JP-A-2007-125732 disclose a liquid ejection apparatus that supplies a drive signal to an upper electrode by setting a switch circuit to be in a conduction state and stops supplying the drive signal to the upper electrode by setting the switch circuit to be in a non-conduction state.

In the liquid ejection apparatus that ejects ink based on the displacement of the piezoelectric element as disclosed in JP-A-2002-273874, JP-A-2002-283567, JP-A-2002-283565, JP-A-2002-264325, JP-A-2003-072069, and JP-A-2007-125732, the supply of the drive signal to the upper electrode of the piezoelectric element is blocked in a case where the switch circuit is controlled to be in the non-conduction state. In such a state where the supply of the drive signal is blocked by the switch circuit, a voltage supplied to the piezoelectric element is ideally maintained at a voltage immediately before the switch circuit is controlled to be in the non-conduction state.

However, in actuality, a leakage current of the switch circuit or the piezoelectric element accumulates or discharges electric charges in the upper electrode of the piezoelectric element, or exogenous noise or the like accumulates electric charges in the upper electrode of the piezoelectric element. The electric potential of the upper electrode is likely to be unstable. In a case where unintended electric charges are accumulated in the upper electrode of the piezoelectric element, an unintended voltage occurs in the upper electrode of the piezoelectric element. Consequently, the piezoelectric element may be unintentionally displaced.

In a case where the piezoelectric element is unintentionally displaced, a vibration plate is also displaced based on the displacement. Consequently, the vibration plate is unintentionally bent, and unintended stress is exerted on the vibration plate. In a case where such unintended stress occurring in the vibration plate is continuously exerted for a long time, stress is concentrated around a contact point between the vibration plate and the cavity, and a crack or the like may occur in the vibration plate.

In addition, in a state where the vibration plate is unintentionally bent, a load that is higher than needed is exerted on the vibration plate in a case where a transition is made to an ejection operation by controlling the switch circuit to be in the conduction state. Consequently, a crack or the like may occur in the vibration plate.

In a case where a crack occurs in the vibration plate, the ink retained in the cavity leaks from the crack, and the amount of ejected ink varies due to a change in the capacity of the cavity. Consequently, the accuracy of ink ejection deteriorates.

Furthermore, in a case where ink leaking from the crack adheres to both of the upper electrode and the lower electrode of the piezoelectric element, a current path is formed between the upper electrode and the lower electrode through the ink. Consequently, the electric potential of a reference voltage signal supplied to the lower electrode is changed. In a case where the reference voltage signal is supplied to a plurality of piezoelectric elements in common, a change in the electric potential of the reference voltage signal affects the displacement of the plurality of piezoelectric elements. That is, not only the accuracy of ejection from the nozzle corresponding to the vibration plate having the crack is affected, but also the accuracy of ink ejection in the whole liquid ejection apparatus may be affected.

The above concerns caused by an unstable electric potential at one end of the piezoelectric element are novel and are not disclosed in any of JP-A-2002-273874, JP-A-2002-283567, JP-A-2002-283565, JP-A-2002-264325, JP-A-2003-072069, and JP-A-2007-125732.

SUMMARY

According to an aspect of the invention, there is provided a print head including a first piezoelectric element that includes a first electrode supplied with a drive signal and a second electrode supplied with a reference voltage signal and is displaced by a difference in electric potential between the first electrode and the second electrode, a cavity that is filled with a liquid ejected from a nozzle along with the displacement of the first piezoelectric element, a vibration plate that is disposed between the cavity and the first piezoelectric element, a first switch circuit that switches between supplying and not supplying the drive signal to the first electrode, and a second switch circuit that switches between electrically connecting and not electrically connecting the first electrode and the second electrode depending on an electric potential of the drive signal.

The print head may further include a second piezoelectric element that includes a third electrode supplied with the drive signal and a fourth electrode supplied with the reference voltage signal and is displaced by a difference in electric potential between the third electrode and the fourth electrode, a third switch circuit that switches between supplying and not supplying the drive signal to the third electrode, and a fourth switch circuit that switches between electrically connecting and not electrically connecting the first electrode and the third electrode depending on the electric potential of the drive signal.

In the print head, the first piezoelectric element may be formed as a polycrystalline body and be subjected to a polarization process.

In the print head, the second switch circuit may electrically connect the first electrode and the second electrode in a case where the drive signal has an electric potential lower than a predetermined electric potential.

In the print head, a resistance component when the first switch circuit is in an OFF state may be smaller than a resistance component of the first piezoelectric element.

According to another aspect of the invention, there is provided a liquid ejection apparatus including a drive circuit that outputs a drive signal, a first piezoelectric element that includes a first electrode supplied with the drive signal and a second electrode supplied with a reference voltage signal and is displaced by a difference in electric potential between the first electrode and the second electrode, a cavity that is filled with a liquid ejected from a nozzle along with the displacement of the first piezoelectric element, a vibration plate that is disposed between the cavity and the first piezoelectric element, a first switch circuit that switches between supplying and not supplying the drive signal to the first electrode, and a second switch circuit that switches between electrically connecting and not electrically connecting the first electrode and the second electrode depending on an electric potential of the drive signal.

The liquid ejection apparatus may further include a second piezoelectric element that includes a third electrode supplied with the drive signal and a fourth electrode supplied with the reference voltage signal and is displaced by a difference in electric potential between the third electrode and the fourth electrode, a third switch circuit that switches between supplying and not supplying the drive signal to the third electrode, and a fourth switch circuit that switches between electrically connecting and not electrically connecting the first electrode and the third electrode depending on the electric potential of the drive signal.

In the liquid ejection apparatus, the first piezoelectric element may be formed as a polycrystalline body and be subjected to a polarization process.

In the liquid ejection apparatus, the second switch circuit may electrically connect the first electrode and the second electrode in a case where the drive signal has an electric potential lower than a predetermined electric potential.

In the liquid ejection apparatus, a resistance component when the first switch circuit is in an OFF state may be smaller than a resistance component of the first piezoelectric element.

According to still another aspect of the invention, there is provided a piezoelectric element control circuit controlling a first piezoelectric element of a print head including the first piezoelectric element that includes a first electrode supplied with a drive signal and a second electrode supplied with a reference voltage signal and is displaced by a difference in electric potential between the first electrode and the second electrode, a cavity that is filled with a liquid ejected from a nozzle along with the displacement of the first piezoelectric element, and a vibration plate that is disposed between the cavity and the first piezoelectric element. The piezoelectric element control circuit includes a first switch circuit that switches between supplying and not supplying the drive signal to the first electrode, and a second switch circuit that switches between electrically connecting and not electrically connecting the first electrode and the second electrode depending on an electric potential of the drive signal.

In the piezoelectric element control circuit, the print head may further include a second piezoelectric element that includes a third electrode supplied with the drive signal and a fourth electrode supplied with the reference voltage signal and is displaced by a difference in electric potential between the third electrode and the fourth electrode, and the piezoelectric element control circuit may further include a third switch circuit that switches between supplying and not supplying the drive signal to the third electrode, and a fourth switch circuit that switches between electrically connecting and not electrically connecting the first electrode and the third electrode depending on the electric potential of the drive signal.

In the piezoelectric element control circuit, the first piezoelectric element may be formed as a polycrystalline body and be subjected to a polarization process.

In the piezoelectric element control circuit, the second switch circuit may electrically connect the first electrode and the second electrode in a case where the drive signal has an electric potential lower than a predetermined electric potential.

In the piezoelectric element control circuit, a resistance component when the first switch circuit is in an OFF state may be smaller than a resistance component of the first piezoelectric element.

BRIEF DESCRIPTION OF THE DRAWINGS

The invention will be described with reference to the accompanying drawings, wherein like numbers reference like elements.

FIG. 7 is a diagram illustrating one example of a drive signal in a printing mode.

FIG. 9 is a diagram illustrating a decoding content in a decoder.

DESCRIPTION OF EXEMPLARY EMBODIMENTS

Hereinafter, an exemplary embodiment of the invention will be described using the drawings. The drawings are used for convenience of description. The embodiment described below does not unduly limit the content of the invention disclosed in the claims. In addition, not all configurations described below are essential constituents of the invention.

Hereinafter, a liquid ejection apparatus that includes a print head according to the invention will be described with an example as an ink jet printer that is a printing apparatus ejecting ink as a liquid.

The liquid ejection apparatus can be exemplified by, for example, a printing apparatus such as an ink jet printer, a coloring material ejection apparatus used for manufacturing a color filter of a liquid crystal display and the like, an electrode material ejection apparatus used for forming an electrode of an organic EL display, a surface-emitting display, and the like, and a bio-organic matter ejection apparatus used for manufacturing a biochip.

1 Configuration of Liquid Ejection Apparatus

A printing apparatus as one example of the liquid ejection apparatus according to the embodiment is an ink jet printer that forms a dot on a printing medium such as paper and prints an image including a character, a figure, and the like corresponding to the image data by ejecting ink depending on image data supplied from an external host computer.

Figure 1:
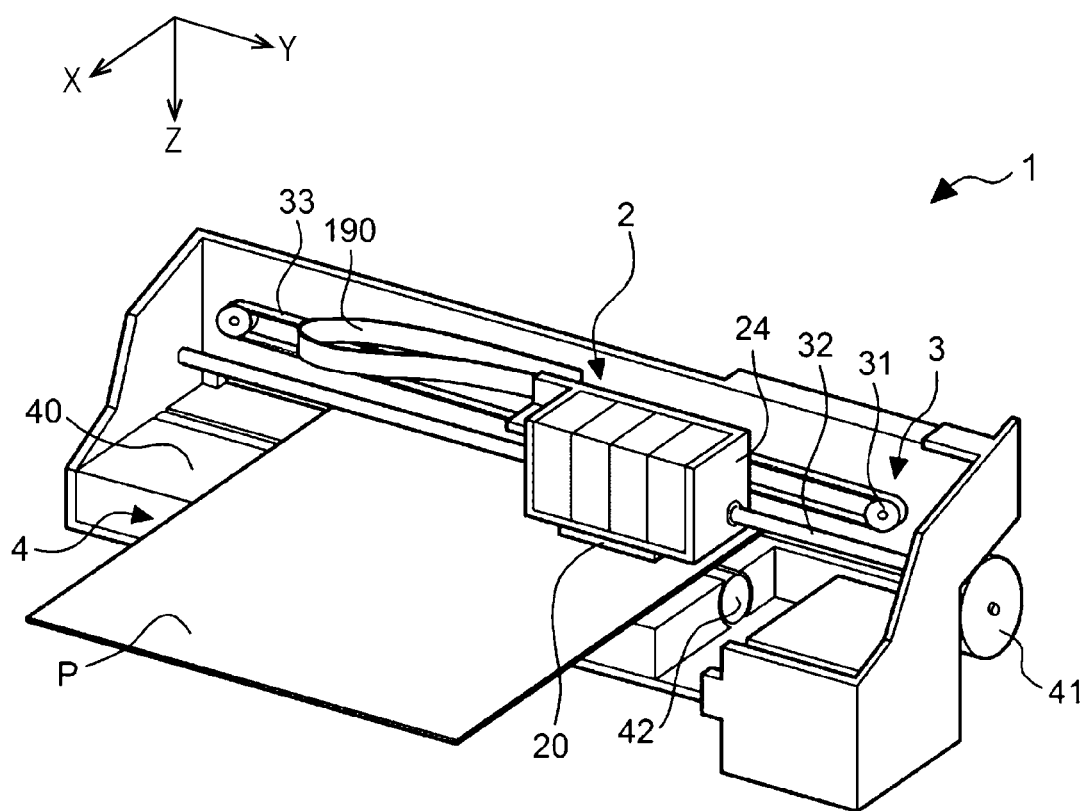
FIG. 1 is a perspective view illustrating a schematic configuration of a liquid ejection apparatus.

FIG. 1 is a perspective view illustrating a schematic configuration of a liquid ejection apparatus 1. FIG. 1 illustrates a direction X in which a medium P is transported, a direction Y that intersects with the direction X and is a direction in which a moving object 2 reciprocates, and a direction Z in which ink is ejected. In the embodiment, the direction X, the direction Y, and the direction Z will be described as axes that are orthogonal to each other.

As illustrated in FIG. 1, the liquid ejection apparatus 1 includes the moving object 2 and a moving mechanism 3 that causes the moving object 2 to reciprocate in the direction Y.

The moving mechanism 3 includes a carriage motor 31 as a drive source of the moving object 2, a carriage guide shaft 32 with its both ends fixed, and a timing belt 33 that extends almost parallel to the carriage guide shaft 32 and is driven by the carriage motor 31.

A carriage 24 included in the moving object 2 is supported by the carriage guide shaft 32 in a manner capable of reciprocating and is fixed at a part of the timing belt 33. Thus, by driving the timing belt 33 using the carriage motor 31, the moving object 2 is guided by the carriage guide shaft 32 and reciprocates in the direction Y.

A print head 20 is disposed in a part of the moving object 2 facing the medium P. The print head 20 includes multiple nozzles. Ink is ejected from each nozzle in the direction Z. In addition, the print head 20 is supplied with a control signal and the like through a flexible cable 190.

The liquid ejection apparatus 1 includes a transport mechanism 4 that transports the medium P in the direction X onto a platen 40. The transport mechanism 4 includes a transport motor 41 as a drive source and a transport roller 42 that is rotated by the transport motor 41 and transports the medium P in the direction X.

At a timing at which the medium P is transported by the transport mechanism 4, the print head 20 ejects ink to the medium P, thereby forming an image on the surface of the medium P.

Figure 2:
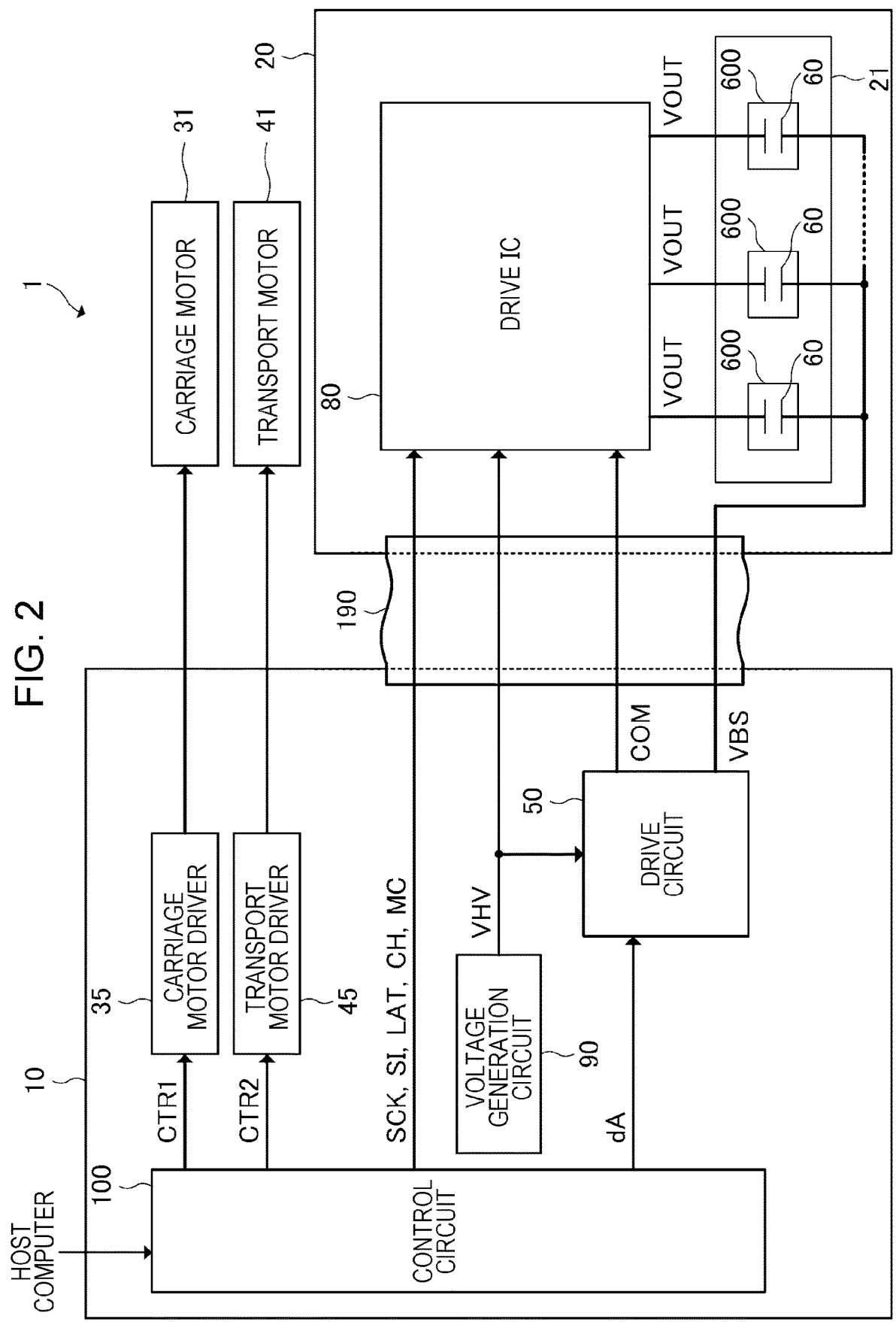
FIG. 2 is a block diagram illustrating an electrical configuration of the liquid ejection apparatus.

FIG. 2 is a block diagram illustrating an electrical configuration of the liquid ejection apparatus 1.

As illustrated in FIG. 2, the liquid ejection apparatus 1 includes a control unit 10 and the print head 20. In addition, the control unit 10 and the print head 20 are connected through the flexible cable 190.

The control unit 10 includes a control circuit 100, a carriage motor driver 35, a transport motor driver 45, a drive circuit 50, and a voltage generation circuit 90.

The control circuit 100 supplies a plurality of control signals and the like for controlling various configurations based on the image data supplied from the host computer.

Specifically, the control circuit 100 supplies a control signal CTR1 to the carriage motor driver 35. The carriage motor driver 35 drives the carriage motor 31 in accordance with the control signal CTR1. Accordingly, movement of the carriage 24 illustrated in FIG. 1 in the direction Y is controlled.

In addition, the control circuit 100 supplies a control signal CTR2 to the transport motor driver 45. The transport motor driver 45 drives the transport motor 41 in accordance with the control signal CTR2. Accordingly, movement of the medium P in the direction X by the transport mechanism 4 illustrated in FIG. 1 is controlled.

In addition, the control circuit 100 supplies a clock signal SCK, a printing data signal SI, a latch signal LAT, a change signal CH, and an operation mode signal MC to the print head 20.

In addition, the control circuit 100 supplies a drive data signal dA to the drive circuit 50.

The voltage generation circuit 90 generates, for example, a voltage VHV of DC 42 V and supplies the voltage VHV to the print head 20 and the drive circuit 50.

The drive circuit 50 generates a drive signal COM by performing class D amplification on a signal based on the drive data signal dA to a voltage based on the voltage VHV and supplies the drive signal COM to the print head 20. In addition, the drive circuit 50 generates, for example, a reference voltage signal VBS of DC 5 V stepped down from the voltage VHV and supplies the reference voltage signal VBS to the print head 20.

The print head 20 includes a drive IC 80 and an ejection module 21.

The drive IC 80 is supplied with the clock signal SCK, the printing data signal SI, the latch signal LAT, the change signal CH, the operation mode signal MC, the voltage VHV, and the drive signal COM.

The drive IC 80 switches between selecting and not selecting the drive signal COM in a predetermined period based on the clock signal SCK, the printing data signal SI, the operation mode signal MC, the latch signal LAT, and the change signal CH. The drive signal COM selected by the drive IC 80 is supplied to the ejection module 21 as a drive signal VOUT. For example, the voltage VHV is used for generating a high voltage logic signal for selecting the drive signal COM.

The ejection module 21 includes a plurality of ejection units 600, each of which includes a piezoelectric element 60.

The drive signal VOUT supplied to the ejection module 21 is supplied to one end of the piezoelectric element 60. In addition, the reference voltage signal VBS is supplied to the other end of the piezoelectric element 60. The piezoelectric element 60 is displaced depending on the difference in electric potential between the drive signal VOUT and the reference voltage signal VBS. The amount of ink corresponding to the displacement is ejected from the ejection unit 600.

While the number of print heads 20 included in the liquid ejection apparatus 1 is described as one in FIG. 2, a plurality of print heads 20 may be included. In addition, while the number of ejection modules 21 included in the print head 20 is described as one in FIG. 2, a plurality of ejection modules 21 may be included. In addition, while the drive circuit 50 is described as being included in the control unit 10 in FIG. 2, the drive circuit 50 may be included outside the control unit 10 and may be electrically connected to the control unit 10 through the flexible cable 190. That is, the drive circuit 50 may be disposed in the carriage 24 illustrated in FIG. 1 and may be operated by supplying the drive data signal dA to the drive circuit 50 through the flexible cable 190.

The liquid ejection apparatus 1 described above includes a plurality of operation modes including a printing mode, a standby mode, and a sleep mode.

The printing mode is an operation mode in which printing can be executed by ejecting ink to the medium P based on the supplied image data. The standby mode is an operation mode in which printing can be executed for a short time at an electric power consumption reduced from that in the printing mode in a case where image data is supplied. The sleep mode is an operation mode in which the electric power consumption can be further reduced from that in the standby mode.

Figure 3:
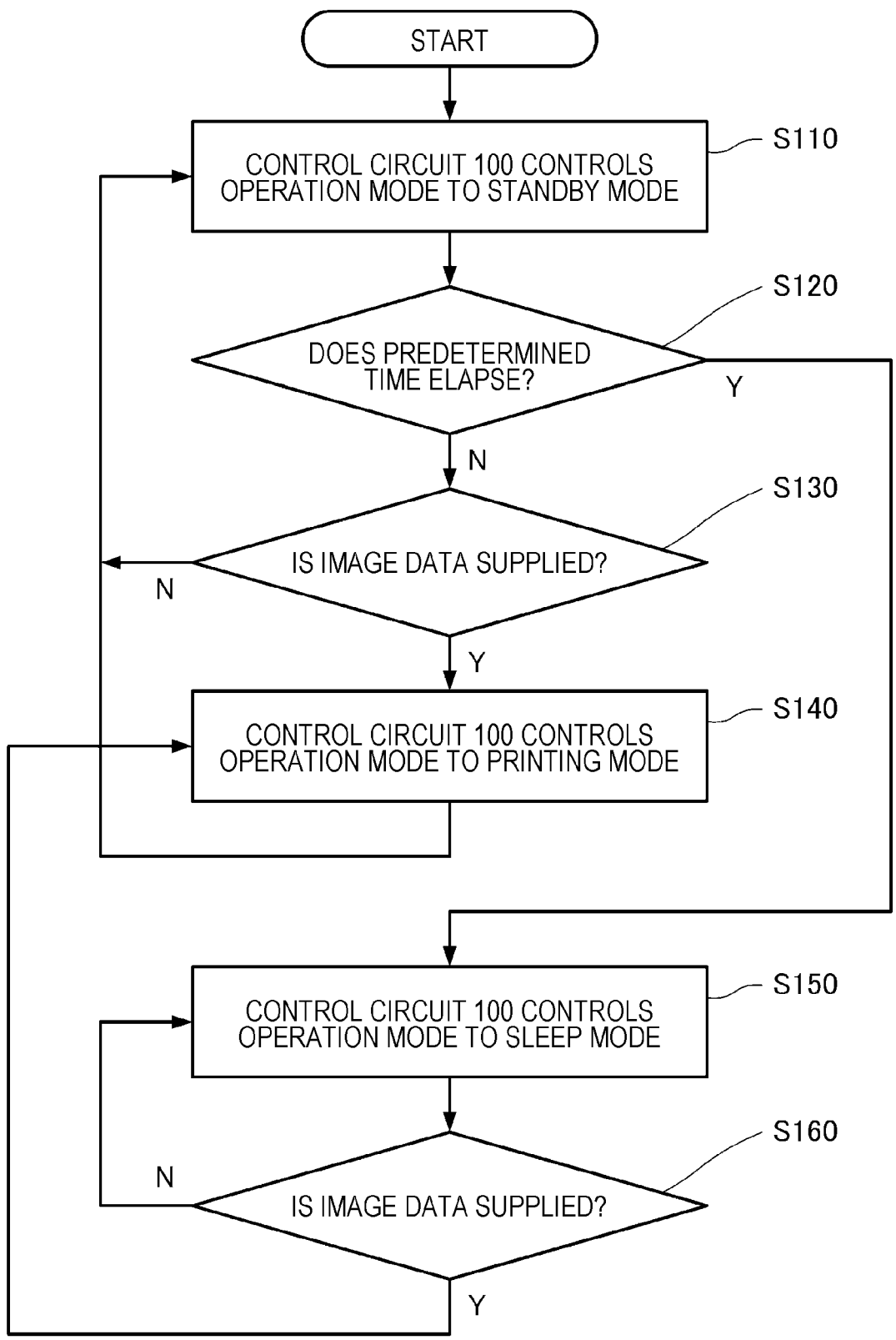
FIG. 3 is a flowchart for describing a mode transition in each operation mode of the liquid ejection apparatus.

The relationship between each operation mode included in the liquid ejection apparatus 1 will be described using FIG. 3. FIG. 3 is a flowchart for describing a mode transition in each operation mode of the liquid ejection apparatus 1.

As illustrated in FIG. 3, in a case where the liquid ejection apparatus 1 is powered up, the control circuit 100 controls the operation mode to the standby mode (S110). The control circuit 100 determines whether or not a predetermined time elapses from the transition to the standby mode (S120).

In a case where the predetermined time does not elapse (N in S120), the control circuit 100 determines whether or not image data is supplied to the liquid ejection apparatus 1 (S130).

In a case where image data is not supplied (N in S130), the standby mode continues. In a case where image data is supplied (Y in S130), the control circuit 100 controls the operation mode to the printing mode (S140). In a case where printing corresponding to the supplied image data is finished, the control circuit 100 controls the operation mode to the standby mode (S110).

In addition, in a case where the predetermined time elapses (Y in S120), the control circuit 100 controls the operation mode to the sleep mode (S150).

After the transition is made to the sleep mode, the control circuit 100 determines whether or not image data is supplied to the liquid ejection apparatus 1 (S160).

In a case where image data is not supplied (N in S160), the sleep mode continues. In a case where image data is supplied (Y in S160), the control circuit 100 controls the operation mode to the printing mode (S140).

The liquid ejection apparatus 1 may include operation modes other than the above operation modes as the plurality of operation modes. For example, the liquid ejection apparatus 1 may include operation modes such as a test printing mode for performing test printing on the medium P and a stop mode for stopping operation due to ink depletion, defective transport of the medium P, and the like.

2 Configuration and Operation of Ejection Unit

Next, a configuration and operation of the ejection module 21 and the ejection unit 600 will be described.

Figure 4:
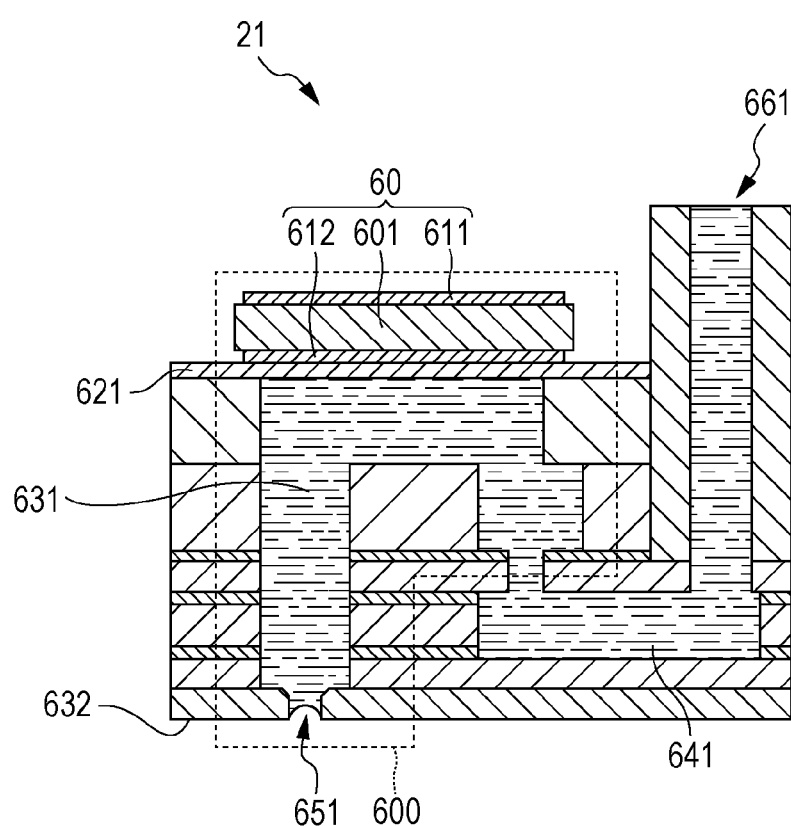
FIG. 4 is a sectional view illustrating a schematic configuration of an ejection unit.

FIG. 4 is a sectional view illustrating a schematic configuration of the ejection unit 600 taken by cutting the ejection module 21 such that the sectional view includes the ejection unit 600. As illustrated in FIG. 4, the ejection module 21 includes the ejection unit 600 and a reservoir 641.

The reservoir 641 is disposed for each color of ink. Ink is introduced into the reservoir 641 from a supply port 661.

The ejection unit 600 includes the piezoelectric element 60 a vibration plate 621, a cavity 631, and a nozzle 651. The vibration plate 621 is disposed between the cavity 631 and the piezoelectric element 60 and is displaced by the piezoelectric element 60 disposed on its upper surface. The vibration plate 621 functions as a diaphragm that increases/decreases the internal capacity of the cavity 631 filled with ink. The nozzle 651 is an open hole unit that is disposed in a nozzle plate 632 and communicates with the cavity 631. The cavity 631 is filled with ink and functions as a pressure chamber of which the internal capacity is changed by displacement of the piezoelectric element 60. The nozzle 651 communicates with the cavity 631 and ejects ink in the cavity 631 in response to a change in the internal capacity of the cavity 631.

The piezoelectric element 60 illustrated in FIG. 4 has a structure in which a piezoelectric body 601 is interposed between a pair of a first electrode 611 and a second electrode 612. The first electrode 611 is supplied with the drive signal VOUT, and the second electrode 612 is supplied with the reference voltage signal VBS. In the piezoelectric element 60 having such a structure, the center part of the piezoelectric body 601 is displaced in an up-down direction with respect to both end parts of the piezoelectric body 601 along with the first electrode 611, the second electrode 612, and the vibration plate 621 depending on the difference in electric potential between the first electrode 611 and the second electrode 612. Ink is ejected from the nozzle 651 along with the displacement of the piezoelectric element 60.

Figure 5:
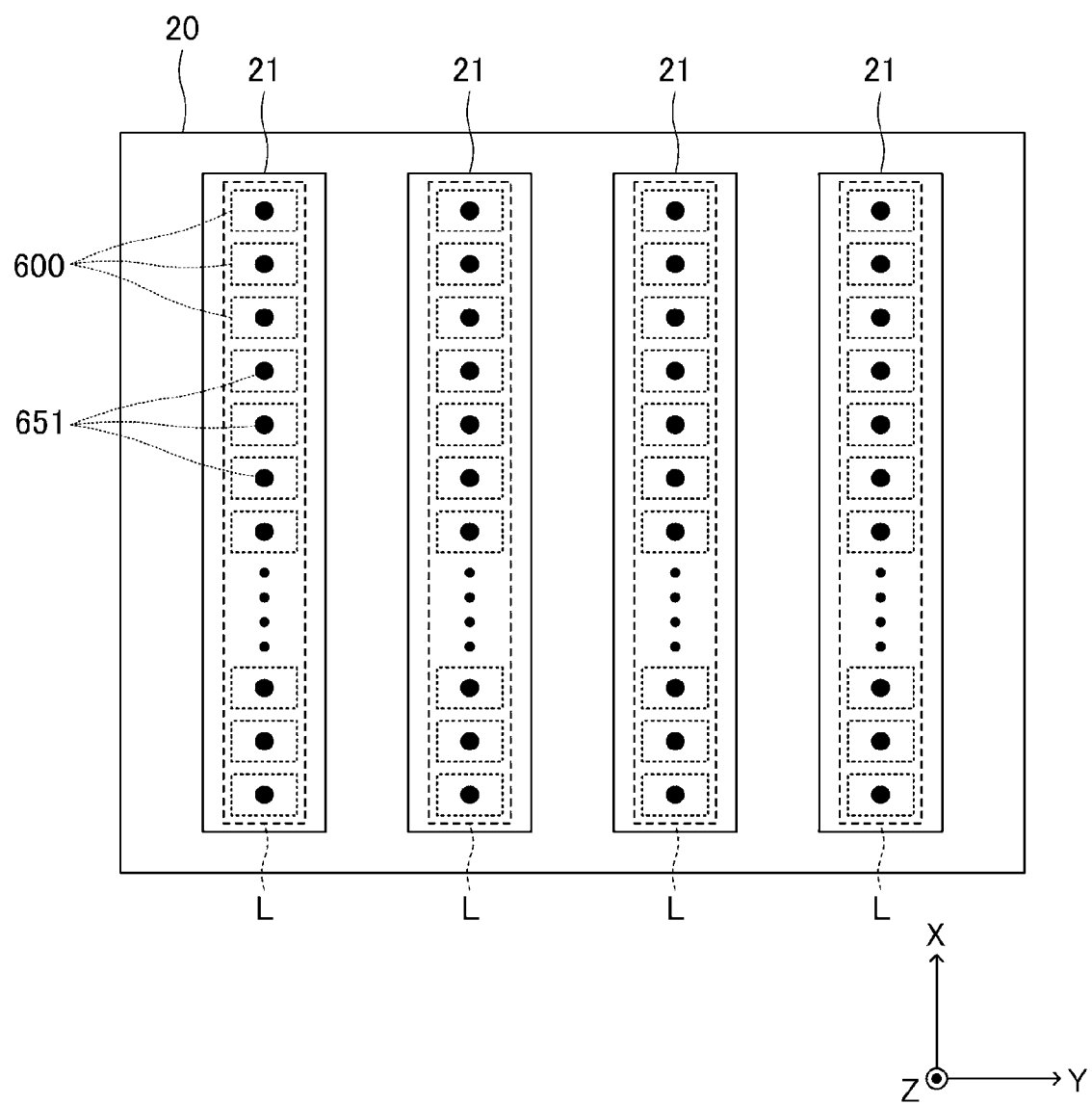
FIG. 5 is a diagram illustrating one example of arrangement of an ejection module and a plurality of nozzles disposed in the ejection module.

FIG. 5 is a diagram illustrating one example of arrangement of the ejection module 21 and a plurality of nozzles 651 disposed in the ejection module 21 in a case where the liquid ejection apparatus 1 is seen in a plan view in the direction Z. In FIG. 5, the print head 20 is described as including four ejection modules 21.

As illustrated in FIG. 5, a nozzle array L that includes a plurality of nozzles 651 disposed in an array form in a predetermined direction is disposed in each ejection module 21. Each nozzle array L is formed by n nozzles 651 arranged in an array form in the direction X.

The nozzle array L illustrated in FIG. 5 is one example and may be configured in a different manner. For example, in each nozzle array L, n nozzles 651 may be arranged in a zigzag form such that even-numbered nozzles 651 counted from the end are at different positions in the direction Y from odd-numbered nozzles 651. In addition, each nozzle array L may be formed in a direction different from the direction X. In addition, while the number of nozzle arrays L disposed in each ejection module 21 is illustrated as "1" in the embodiment, "2" or more nozzle arrays L may be formed in each ejection module 21.

In the embodiment, n nozzles 651 forming the nozzle array L are disposed at a high density of 300 or more per one inch in the ejection module 21. Thus, in the ejection module 21, n piezoelectric elements 60 are disposed at a high density in correspondence with n nozzles 651.

In addition, in the embodiment, it is preferable that the piezoelectric body 601 used in the piezoelectric element 60 be a thin film having a thickness of, for example, 1 μm or less. Accordingly, the amount of displacement of the piezoelectric element 60 with respect to the difference in electric potential between the first electrode 611 and the second electrode 612 can be increased.

Figure 6A:
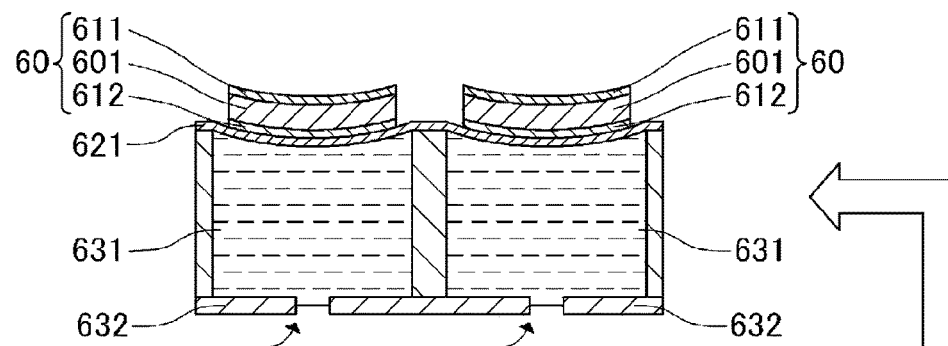
FIGS. 6A-C are diagrams for describing a relationship between displacement of a piezoelectric element and a vibration plate and ejection.
Figure 6B:
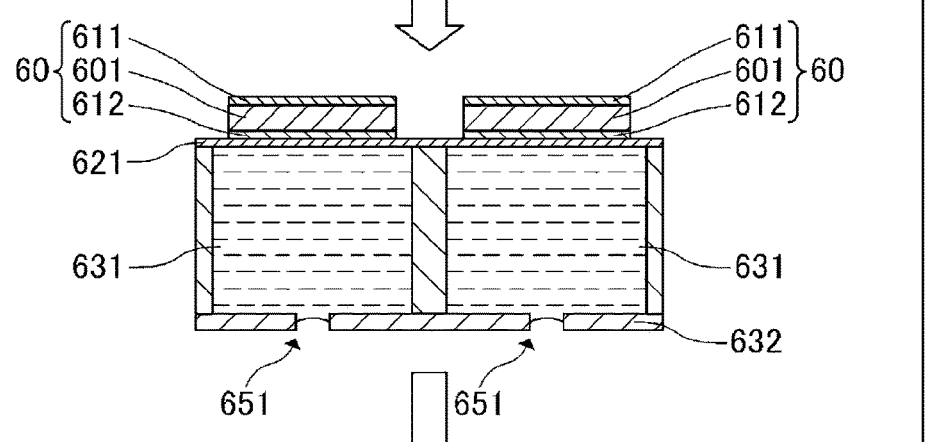
Figure 6C:
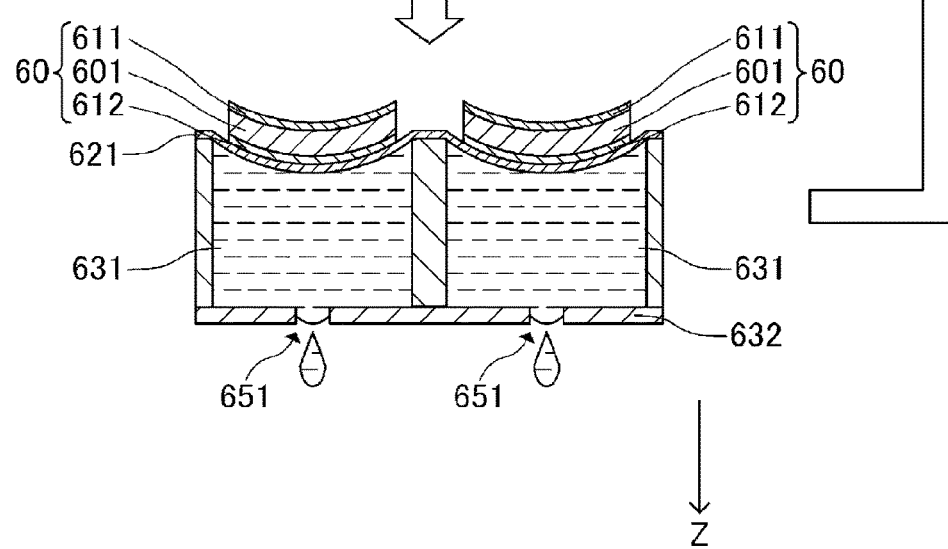

An ejection operation for ink ejected from the nozzle 651 will be described using FIGS. 6A-C. FIGS. 6A-C are diagrams for describing a relationship between displacement of the piezoelectric element 60 and the vibration plate 621 and ejection in a case where the drive signal VOUT is supplied to the piezoelectric element 60. In FIG. 6A, displacement of the piezoelectric element 60 and the vibration plate 621 in a case where a voltage Vc is supplied as the drive signal VOUT is schematically illustrated. In addition, in FIG. 6B, displacement of the piezoelectric element 60 and the vibration plate 621 in a case where the voltage value of the drive signal VOUT supplied to the piezoelectric element 60 is controlled to approach the reference voltage signal VBS from the voltage Vc is schematically illustrated. In addition, in FIG. 6C, displacement of the piezoelectric element 60 and the vibration plate 621 in a case where the voltage value of the drive signal VOUT supplied to the piezoelectric element 60 is controlled to further recede from the reference voltage signal VBS than the voltage Vc is schematically illustrated.

In the state of FIG. 6A, the piezoelectric element and the vibration plate 621 are displaced depending on the difference in electric potential between the drive signal VOUT supplied to the first electrode 611 and the reference voltage signal VBS supplied to the second electrode 612. Specifically, the piezoelectric element 60 and the vibration plate 621 are bent in the direction Z. At this point, the first electrode 611 is supplied with the voltage Vc as the drive signal VOUT. As will be illustrated in FIG. 7, the voltage Vc is the voltage value at the start timing and the end timing of voltage waveforms Adp, Bdp, and Cdp constituting the drive signal COM. That is, the state of the piezoelectric element 60 and the vibration plate 621 illustrated in FIG. 6A is a reference state of the piezoelectric element 60 in the printing mode.

In a case where the voltage value of the drive signal VOUT is controlled to approach the voltage value of the reference voltage signal VBS, the displacement of the piezoelectric element 60 and the vibration plate 621 in the direction Z is reduced as illustrated in FIG. 6B. At this point, the internal capacity of the cavity 631 is increased, and ink is drawn into the cavity 631 from the reservoir 641.

Then, the voltage value of the drive signal VOUT is controlled to recede from the voltage value of the reference voltage signal VBS. At this point, as illustrated in FIG. 6C, the displacement of the piezoelectric element 60 and the vibration plate 621 in the direction Z is increased. Accordingly, the internal capacity of the cavity 631 is decreased, and ink filling the cavity 631 is ejected from the nozzle 651.

The ejection unit 600 is repeatedly set to be in the states of FIGS. 6A-C by supplying the drive signal VOUT to the first electrode 611. Accordingly, ink is ejected from the nozzle 651, and a dot is formed on the medium P. The displacement of the piezoelectric element 60 and the vibration plate 621 illustrated in FIGS. 6A-C is increased in the direction Z as the difference in electric potential between the drive signal VOUT supplied to the first electrode 611 and the reference voltage signal VBS supplied to the second electrode 612 is increased. That is, the amount of ejection of ink ejected from the nozzle 651 is controlled depending on the difference in electric potential between the drive signal VOUT and the reference voltage signal VBS.

The displacement of the piezoelectric element 60 and the vibration plate 621 with respect to the drive signal VOUT illustrated in FIGS. 6A-C is merely one example. For example, ink may be drawn into the cavity 631 from the reservoir 641 in a case where the difference in electric potential between the drive signal VOUT and the reference voltage signal VBS is large. Ink filling the cavity 631 may be ejected from the nozzle 651 in a case where the difference in electric potential between the drive signal VOUT and the reference voltage signal VBS is small.

3 Configuration and Operation of Drive IC

Next, a configuration and operation of the drive IC 80 that is an integrated circuit device will be described.

First, one example of the drive signal COM supplied to the drive IC 80 will be described using FIG. 7. Then, the configuration and operation of the drive IC 80 will be described using FIG. 8 to FIG. 10.

FIG. 7 is a diagram illustrating one example of the drive signal COM in the printing mode. FIG. 7 illustrates a period T1 from a rise of the latch signal LAT until a rise of the change signal CH, a period T2 after the period T1 until the subsequent rise of the change signal CH, and a period T3 after the period T2 until a rise of the latch signal LAT. A cycle that includes the periods T1, T2, and T3 is a cycle Ta of forming a new dot on the medium P.

As illustrated in FIG. 7, in the printing mode, the drive circuit 50 generates the voltage waveform Adp in the period T1. In a case where the voltage waveform Adp is supplied to the piezoelectric element 60, a predetermined amount of ink, specifically, approximately a medium amount of ink, is ejected from the corresponding ejection unit 600.

In addition, the drive circuit 50 generates the voltage waveform Bdp in the period T2. In a case where the voltage waveform Bdp is supplied to the piezoelectric element 60, approximately a small amount of ink smaller than the predetermined amount is ejected from the corresponding ejection unit 600.

In addition, the drive circuit 50 generates the voltage waveform Cdp in the period T3. In a case where the voltage waveform Cdp is supplied to the piezoelectric element 60, the piezoelectric element 60 is displaced such that ink is not ejected from the corresponding ejection unit 600. Accordingly, a dot is not formed on the medium P. The voltage waveform Cdp is a voltage waveform for preventing an increase in the viscosity of ink by applying micro-vibration to ink around the open hole unit of the nozzle of the ejection unit 600. In the following description, "micro-vibration" refers to displacement of the piezoelectric element 60 that is performed such that ink is not ejected from the ejection unit 600 in order to prevent an increase in the viscosity of ink.

Both of the voltage values at the start timing and the end timing of the voltage waveform Adp, the voltage waveform Bdp, and the voltage waveform Cdp are equal to the voltage Vc. That is, the voltage waveforms Adp, Bdp, and Cdp are voltage waveforms of which the voltage value starts at the voltage Vc and ends at the voltage Vc. Accordingly, in the printing mode, the drive circuit 50 outputs the drive signal COM having a voltage waveform in which the voltage waveforms Adp, Bdp, and Cdp are consecutive in the cycle Ta.

By supplying the voltage waveform Adp in the period T1 and the voltage waveform Bdp in the period T2 to the first electrode 611, approximately a medium amount of ink and approximately a small amount of ink are ejected from the ejection unit 600 in the cycle Ta. Accordingly, a "large dot" is formed on the medium P. In addition, by supplying the voltage waveform Adp in the period T1 and not supplying the voltage waveform Bdp in the period T2 to the first electrode 611, approximately a medium amount of ink is ejected from the ejection unit 600 in the cycle Ta. Accordingly, a "medium dot" is formed on the medium P. In addition, by not supplying the voltage waveform Adp in the period T1 and supplying the voltage waveform Bdp in the period T2 to the first electrode 611, approximately a small amount of ink is ejected from the ejection unit 600 in the cycle Ta. Accordingly, a "small dot" is formed on the medium P. In addition, by not supplying the voltage waveforms Adp and Bdp in the periods T1 and T2 and supplying the voltage waveform Cdp in the period T3 to the first electrode 611, ink is not ejected from the ejection unit 600 and is subjected to micro-vibration in the cycle Ta. In this case, a dot is not formed on the medium P.

Next, one example of the drive signal COM in the standby mode and the sleep mode will be described. Illustration is not provided for the drive signal COM in the standby mode and the sleep mode.

In the case of the standby mode and the sleep mode, ink is not ejected to the medium P. Thus, the periods T1, T2, and T3 are not defined. Accordingly, in the standby mode and the sleep mode, the latch signal LAT and the change signal CH are signals at L level.

In the standby mode, the drive circuit 50 controls the voltage value of the drive signal COM to approach the voltage value of the reference voltage signal VBS.

In addition, in the sleep mode, the drive circuit 50 stops operating, and immediately afterward, the electric potential of the drive signal COM starts decreasing to a ground electric potential. The situation in which the drive circuit 50 stops operating is a case where the drive circuit is supplied with the drive data signal dA for stopping generation of the drive signal COM, and specifically, includes a situation in which the drive circuit 50 outputs the ground electric potential as the drive signal COM.

In the standby mode, the reference voltage signal VBS outputs the same voltage value as that in the printing mode. Accordingly, printing can be executed for a short time in a case where image data is supplied. In addition, in the sleep mode, the output of the reference voltage signal VBS is stopped, and a voltage signal having the ground electric potential is output. Accordingly, the electric power consumption can be further reduced than that in the standby mode.

Figure 8:
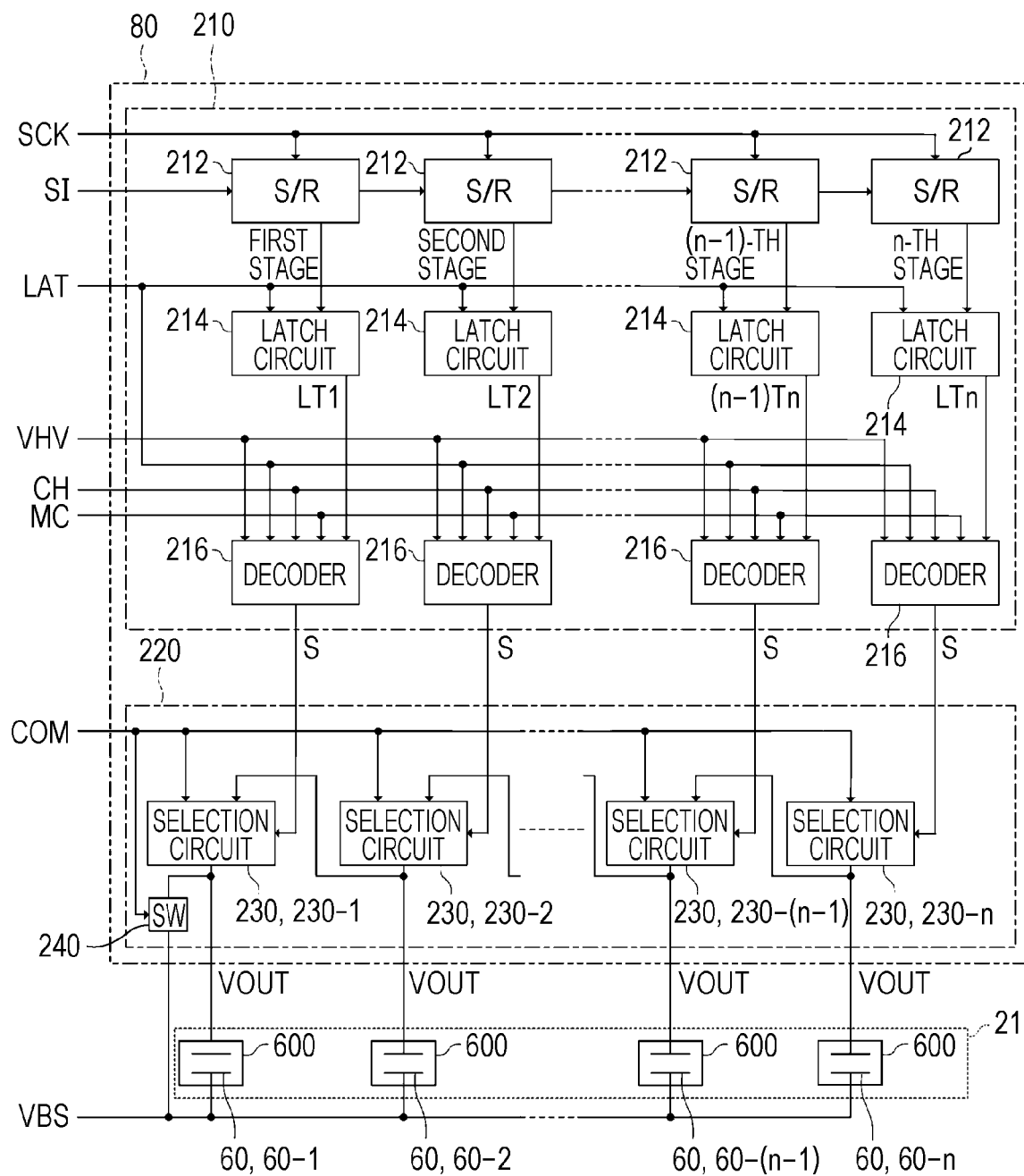
FIG. 8 is a block diagram illustrating an electrical configuration of the ejection module and a drive IC.

FIG. 8 is a block diagram illustrating an electrical configuration of the ejection module 21 and the drive IC 80. As illustrated in FIG. 8, the drive IC 80 includes a selection control circuit 210 and a piezoelectric element control circuit 220.

The selection control circuit 210 is supplied with the clock signal SCK, the printing data signal SI, the latch signal LAT, the change signal CH, the operation mode signal MC, and the voltage VHV. In addition, in the selection control circuit 210, a set of a shift register 212 (S/R), a latch circuit 214, and a decoder 216 is disposed in correspondence with each ejection unit 600. That is, the same number of sets of the shift register 212, the latch circuit 214, and the decoder 216 as the total number n of ejection units 600 are disposed in the print head 20.

The shift register 212 temporarily holds printing data [SIH, SIL] of two bits included in the printing data signal SI for each corresponding ejection unit 600.

Specifically, stages of the shift registers 212 corresponding in number to the ejection units 600 are connected to each other in cascade, and the printing data signal SI that is serially supplied is sequentially transferred to the subsequent stage in accordance with the clock signal SCK. In FIG. 8, for distinction purposes, the shift registers 212 are described as a first stage, a second stage, . . . , an n-th stage in order from an upstream side on which the printing data signal SI is supplied.

Each of n latch circuits 214 latches the printing data [SIH, SIL] held in the corresponding shift register 212 at a rise of the latch signal LAT.

Each of n decoders 216 decodes the printing data [SIH, SIL] of two bits latched by the corresponding latch circuit 214 and operation mode data [MCH, MCL] of two bits included in the operation mode signal MC and generates and outputs a selection signal S.

FIG. 9 is a diagram illustrating a decoding content in the decoder 216.

The printing data [SIH, SIL] of two bits, the operation mode data [MCH, MCL] of two bits, the latch signal LAT, and the change signal CH are input into the decoder 216.

In the case of the printing mode in which the operation mode data [MCH, MCL] is equal to [1, 1], the decoder 216 outputs the selection signal S at a logic level based on the printing data [SIH, SIL] in each of the periods T1, T2, and T3 defined by the latch signal LAT and the change signal CH.

Specifically, in a case where the printing data [SIH, SIL] in the printing mode is equal to [1, 1] that defines the "large dot", the decoder 216 outputs the selection signal S at H level in the period T1, H level in the period T2, and L level in the period T3.

In addition, in a case where the printing data [SIH, SIL] in the printing mode is equal to [1, 0] that defines the "medium dot", the decoder 216 outputs the selection signal S at H level in the period T1, L level in the period T2, and L level in the period T3.

In addition, in a case where the printing data [SIH, SIL] in the printing mode is equal to [0, 1] that defines the "small dot", the decoder 216 outputs the selection signal S at L level in the period T1, H level in the period T2, and L level in the period T3.

In addition, in a case where the printing data [SIH, SIL] in the printing mode is equal to [0, 0] that defines the "micro-vibration", the decoder 216 outputs the selection signal S at L level in the period T1, L level in the period T2, and H level in the period T3.

In addition, in the standby mode and the sleep mode, the decoder 216 determines the logic level of the selection signal S regardless of the printing data [SIH, SIL] and the periods T1, T2, and T3.

Specifically, in the case of the standby mode in which the operation mode data [MCH, MCL] is equal to [1, 0], the decoder 216 outputs the selection signal S at H level.

In addition, in the case of the sleep mode in which the operation mode data [MCH, MCL] is equal to [0, 0], the decoder 216 outputs the selection signal S at L level.

The logic level of the selection signal S is shifted to a high amplitude logic level based on the voltage VHV by a level shifter, not illustrated.

The piezoelectric element control circuit 220 includes a plurality of selection circuits 230 and a switch circuit 240.

The plurality of selection circuits 230 are disposed in correspondence with the ejection units 600, respectively. That is, the number of selection circuits 230 included in one print head 20 is the same as the total number n of ejection units 600 included in the print head 20. Each selection circuit 230 is supplied with the selection signal S from the corresponding decoder 216. The selection circuit 230 selects the drive signal COM based on the selection signal S and supplies the drive signal COM to the piezoelectric element 60 as the drive signal VOUT.

Specifically, in a case where the selection circuit 230 is supplied with the selection signal S at H level, the selection circuit 230 outputs the drive signal COM as the drive signal VOUT. In addition, in a case where the selection circuit 230 is supplied with the selection signal S at L level, the selection circuit 230 does not output the drive signal COM as the drive signal VOUT.

In FIG. 8, among n selection circuits 230, a selection circuit 230-$i$ ($i$ is any of 1 to n) is supplied with the selection signal S that is output from the decoder 216 disposed in correspondence with the shift register 212 in the i-th stage. In addition, among n piezoelectric elements 60, a piezoelectric element 60-$i$ ($i$ is any of 1 to n) is supplied with the drive signal VOUT output from the selection circuit 230-$i$. In the embodiment, the selection circuits 230-1 to 230-(n−1) have the same configuration, and the configuration of the selection circuit 230-$n$ is different from the selection circuits 230-1 to 230-(n−1).

The switch circuit 240 switches between electrically connecting and not electrically connecting the first electrode 611 and the second electrode 612 of the piezoelectric element 60-1 depending on the electric potential of the drive signal COM.

Details of the configuration and operation of the piezoelectric element control circuit 220 will be described below.

In the drive IC 80 described above, an operation of generating the drive signal VOUT based on the drive signal COM and supplying the drive signal VOUT to the ejection unit 600 included in the ejection module 21 will be described using FIG. 10.

Figure 10:
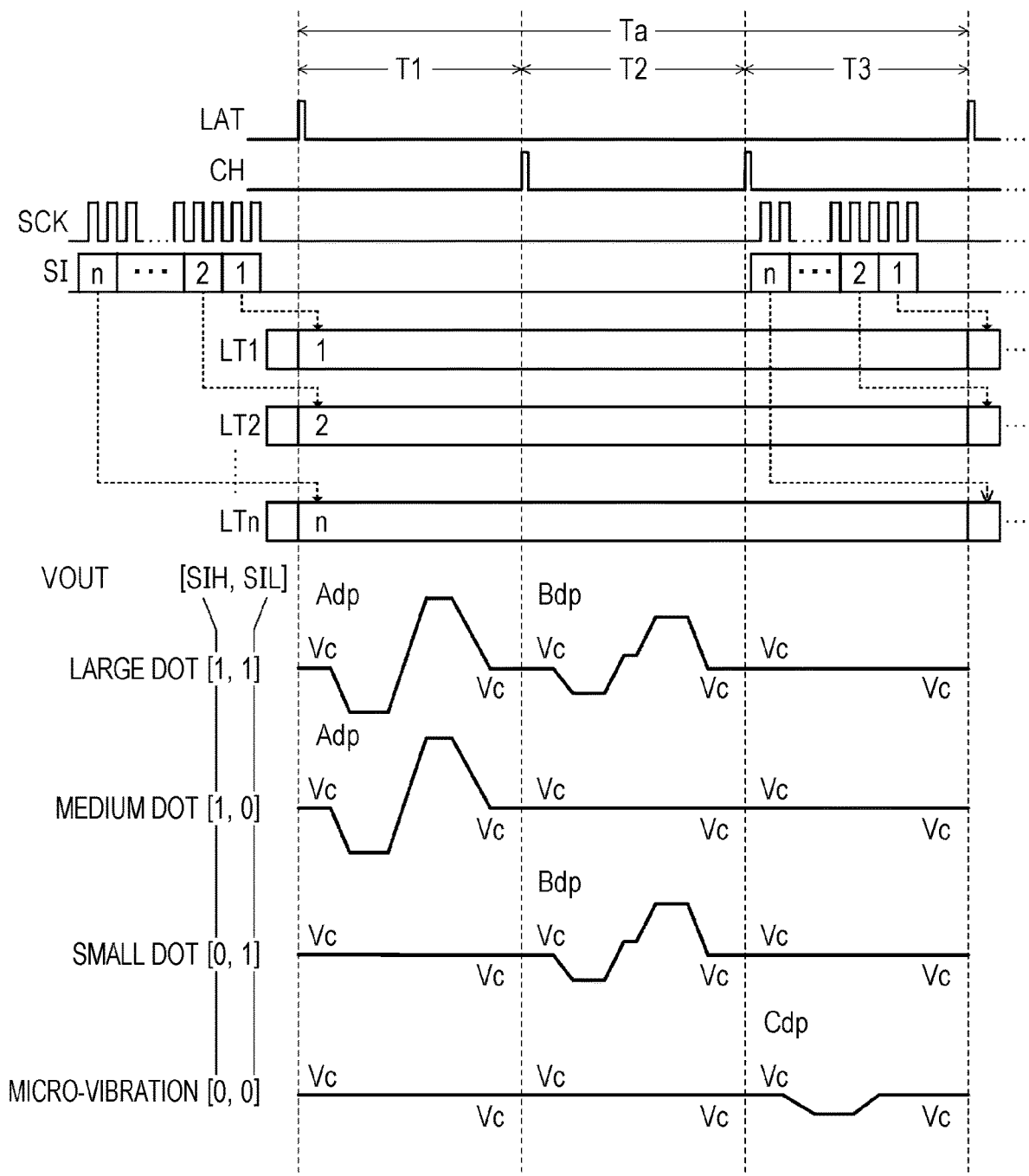
FIG. 10 is a diagram for describing operation of the drive IC in the printing mode.

FIG. 10 is a diagram for describing the operation of the drive IC 80 in the printing mode.

In the printing mode, the printing data signal SI is serially supplied in synchronization with the clock signal SCK and is sequentially transferred in the shift register 212 corresponding to the ejection unit 600. In a case where the supply of the clock signal SCK is stopped, the printing data [SIH, SIL] corresponding to the ejection unit 600 is held in each shift register 212. The printing data signal SI is supplied in an order corresponding to the ejection units 600 in the last n-th stage, . . . , the second stage, and the first stage of the shift registers 212.

In a case where the latch signal LAT rises, each latch circuit 214 latches the printing data [SIH, SIL] held in the corresponding shift register 212 at the same time. In FIG. 10, the printing data [SIH, SIL] latched by the latch circuits 214 corresponding to the first stage, the second stage, . . . , the n-th stage of the shift registers 212 are denoted by LT1, LT2, . . . , LTn.

The decoder 216 outputs the selection signal S at a logic level complying with the content illustrated in FIG. 9 in each of the periods T1, T2, and T3 depending on the size of a dot defined in the latched printing data [SIH, SIL].

In a case where the printing data [SIH, SIL] is equal to [1, 1], the selection circuit 230 selects the voltage waveform Adp in the period T1, selects the voltage waveform Bdp in the period T2, and does not select the voltage waveform Cdp in the period T3 in accordance with the selection signal S. Consequently, the drive signal VOUT corresponding to the large dot illustrated in FIG. 10 is supplied to the piezoelectric element 60.

In addition, in a case where the printing data [SIH, SIL] is equal to [1, 0], the selection circuit 230 selects the voltage waveform Adp in the period T1, does not select the voltage waveform Bdp in the period T2, and does not select the voltage waveform Cdp in the period T3 in accordance with the selection signal S. Consequently, the drive signal VOUT corresponding to the medium dot illustrated in FIG. 10 is supplied to the piezoelectric element 60.

In addition, in a case where the printing data [SIH, SIL] is equal to [0, 1], the selection circuit 230 does not select the voltage waveform Adp in the period T1, selects the voltage waveform Bdp in the period T2, and does not select the voltage waveform Cdp in the period T3 in accordance with the selection signal S. Consequently, the drive signal VOUT corresponding to the small dot illustrated in FIG. 10 is supplied to the piezoelectric element 60.

In addition, in a case where the printing data [SIH, SIL] is equal to [0, 0], the selection circuit 230 does not select the voltage waveform Adp in the period T1, does not select the voltage waveform Bdp in the period T2, and selects the voltage waveform Cdp in the period T3 in accordance with the selection signal S. Consequently, the drive signal VOUT corresponding to the micro-vibration illustrated in FIG. 10 is supplied to the piezoelectric element 60.

Printing is not performed in the standby mode and the sleep mode. Thus, in the standby mode and the sleep mode, not only the latch signal LAT and the change signal CH described above but also the clock signal SCK and the printing data signal SI are signals at L level. Accordingly, the shift register 212 and the latch circuit 214 do not operate. Thus, as described above, the decoder 216 in the standby mode and the sleep mode determines the logic level of the selection signal S in accordance with the operation mode signal MC and outputs the selection signal S.

In the case of the standby mode in which the operation mode data [MCH, MCL] is equal to [1, 0], the selection circuit 230 selects the drive signal COM having a voltage value equal to the reference voltage signal VBS in accordance with the supplied selection signal S at H level. Consequently, the drive signal VOUT having a voltage value equal to the reference voltage signal VBS is supplied to the piezoelectric element 60.

In addition, in the case of the sleep mode in which the operation mode data [MCH, MCL] is equal to [0, 0], the selection circuit 230 does not select the drive signal COM as the drive signal VOUT in accordance with the supplied selection signal S at L level. Consequently, the piezoelectric element 60 is not supplied with the drive signal VOUT.

4 Cause and Concern about Unstable Electric Potential of Piezoelectric Element

As described above, in the sleep mode in the embodiment, the selection circuit 230 does not select the drive signal COM as the drive signal VOUT. In this case, the supply of the drive signal VOUT to the first electrode 611 is blocked in the selection circuit 230. Thus, the first electrode 611 ideally holds a voltage that is supplied immediately before a transition to the sleep mode.

However, in actuality, the voltage held in the first electrode 611 may be changed in the sleep mode. The cause of a change in the voltage held in the first electrode 611 is exemplified by for example, accumulation or discharging of electric charges in the first electrode 611 due to occurrence of a leakage current in the selection circuit 230 and the piezoelectric element 60. In addition, electric charges may be accumulated in the first electrode 611 due to exogenous noise or the like. Accumulation or discharging of electric charges in the first electrode 611 changes the voltage of the first electrode 611.

Furthermore, in a case where the nozzles 651 are disposed at a high density of 300 or more per inch as illustrated in the embodiment, the piezoelectric elements 60 corresponding to the nozzles 651 are also disposed at a high density. Thus, the electrode area of the piezoelectric element 60 is decreased, and the resistance component of the piezoelectric element 60 is increased. Accordingly, discharging of electric charges accumulated in the first electrode 611 due to the leakage current or the exogenous noise or the like is hindered, and the electric potential of the first electrode 611 of the piezoelectric element 60 may likely become unstable.

As described above, the electric potential of the first electrode 611 changes and becomes unstable due to accumulation or discharging of electric charges in the first electrode 611. In a case where the electric potential of the first electrode 611 is unstable, an unintended voltage is generated in the first electrode 611, and the piezoelectric element 60 may be unintentionally displaced.

Figure 11A:
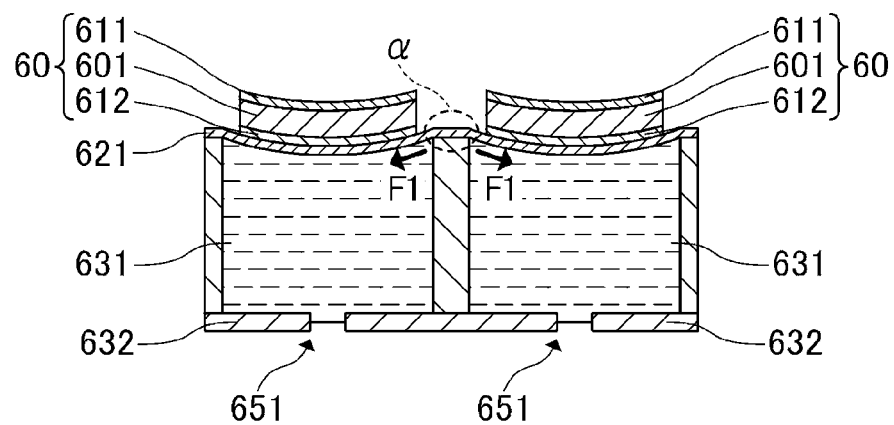
FIGS. 11A-B are diagrams schematically illustrating the displacement of the piezoelectric element and the vibration plate in a case where a voltage value of an electrode of the piezoelectric element is increased.
Figure 11B:
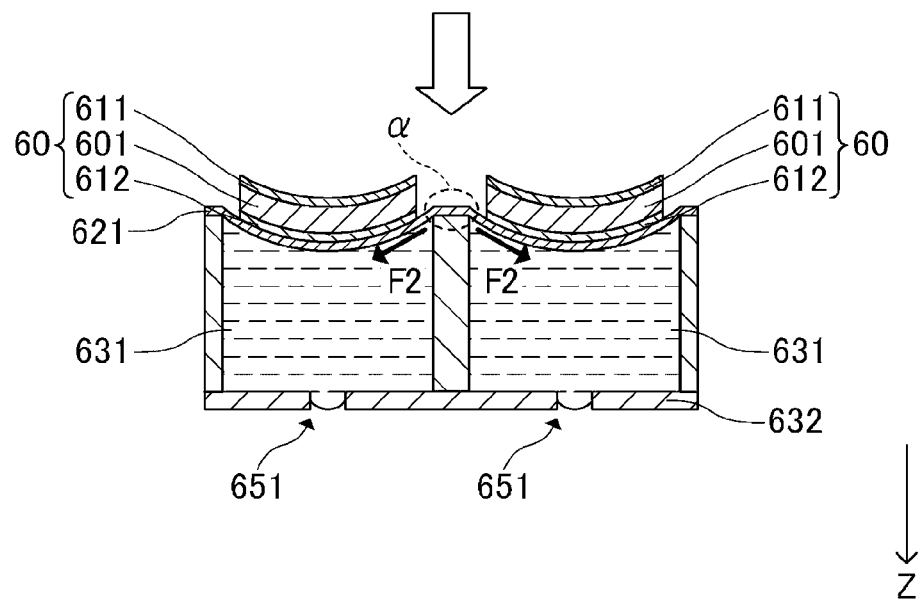

FIGS. 11A-B are diagrams schematically illustrating the displacement of the piezoelectric element 60 and the vibration plate 621 in a case where a voltage is increased due to accumulation of electric charges in the first electrode 611. In FIG. 11A, the displacement of the piezoelectric element 60 and the vibration plate 621 immediately after a transition to the sleep mode is illustrated. In addition, in FIG. 11B, the displacement of the piezoelectric element 60 and the vibration plate 621 in a case where the electric potential of the first electrode 611 is increased after a transition to the sleep mode is illustrated.

As illustrated in FIG. 11A, the piezoelectric element 60 immediately after a transition to the sleep mode is displaced based on the difference in electric potential between the voltage of the first electrode 611 and the voltage of the second electrode 612. At this point, a voltage immediately before a transition to the sleep mode is held in the first electrode 611. That is, the voltage of the first electrode 611 immediately after a transition to the sleep mode is a voltage that is assumed to be held in the first electrode 611. Accordingly, the piezoelectric element 60 is displaced within an assumed range. Similarly, the vibration plate 621 is displaced within an assumed range. At this point, stress F1 within an assumed range occurs at a contact point α between the vibration plate 621 and the cavity 631.

While a case where the voltage of the first electrode 611 and the voltage of the second electrode 612 immediately before a transition to the sleep mode have different voltage values is illustrated in FIG. 11A, it is preferable that the voltage of the first electrode 611 and the voltage of the second electrode 612 have equal voltage values. In this case, the piezoelectric element 60 and the vibration plate 621 are not displaced.

In a case where a voltage changes due to accumulation of unintended electric charges in the first electrode 611, and the difference in electric potential between the voltage of the first electrode 611 and the voltage of the second electrode 612 is increased, the displacement of the piezoelectric element 60 is increased, and the displacement of the vibration plate 621 is increased as illustrated in FIG. 11B. In this case, stress F2 that is more significant than assumed may occur at the contact point α between the vibration plate 621 and the cavity 631.

In an operation mode such as the sleep mode that continues for a long time, the stress F2 may be continuously exerted at the contact point α of the vibration plate 621 for a long time. Consequently, a crack may occur in the vibration plate 621. Furthermore, in a case where a transition is made to the printing mode in a state where the vibration plate 621 is displaced further than assumed, a load that is higher than needed may be exerted on the vibration plate 621 along with the displacement of the piezoelectric element 60 at the time of ejecting ink. Consequently, a crack may occur in the vibration plate 621.

In a case where a crack occurs in the vibration plate 621, ink filling the cavity 631 leaks from the crack. Thus, the amount of ejected ink may vary due to a change in the internal capacity of the cavity 631. Consequently, the accuracy of ink ejection deteriorates.

In addition, in a case where ink leaking from the crack adheres to both of the first electrode 611 and the second electrode 612, a current path is formed between the first electrode 611 and the second electrode 612 through the ink. Accordingly, the voltage value of the reference voltage signal VBS supplied to the second electrode 612 may be changed. In the liquid ejection apparatus 1 illustrated in the embodiment, the reference voltage signal VBS is supplied to a plurality of second electrodes 612 in common. Thus, in a case where the voltage value of the reference voltage signal VBS is changed, the displacement of a plurality of piezoelectric elements 60 is affected. Consequently, the ejection accuracy of the whole liquid ejection apparatus 1 may be affected.

In addition, it is difficult to form the piezoelectric body 601 of the piezoelectric element 60 as a monocrystalline body. Thus, the piezoelectric body 601 is formed as a polycrystalline body that is an aggregation of ferroelectric microcrystals. At the time of manufacturing, the directions of spontaneous polarization of individual microcrystals are spontaneously directed in various directions. Thus, the voltage characteristics of the piezoelectric body 601 are not exhibited. Therefore, a polarization process (poling) of aligning the polarization directions by applying a predetermined direct current electric field to the piezoelectric body is performed before the piezoelectric element 60 is embedded in the print head 20. The polarization process exhibits the voltage characteristics of the piezoelectric body 601.

In the embodiment, in a case where the electric potential of the first electrode 611 of the piezoelectric element 60 is higher than the electric potential of the second electrode 612, an electric field (hereinafter, referred to as a "same polarity electric field") that has the same polarity as the electric field at the time of performing the polarization process on the piezoelectric body 601 of the piezoelectric element 60 is applied. In addition, in a case where the electric potential of the first electrode 611 of the piezoelectric element 60 is lower than the electric potential of the second electrode 612, an electric field (hereinafter, referred to as a "reversed polarity electric field") that has a reversed polarity with respect to the electric field at the time of performing the polarization process on the piezoelectric body 601 of the piezoelectric element 60 is applied.

In a case where the reversed polarity electric field is applied to the piezoelectric element 60, the polarization direction aligned by the polarization process in the piezoelectric body 601 is disturbed. Such disturbance of the polarization direction degrades the voltage characteristics and thus, may cause defective operation of the piezoelectric element 60.

Since the piezoelectric body 601 is a polycrystalline body, local stress concentration or the like occurs in the course of manufacturing or the course of the polarization process, and the piezoelectric body 601 has a potential microcrack. The application of the reversed polarity electric field to the piezoelectric element 60 not only disturbs the polarization direction of the piezoelectric body 601 but also due to the fact that the way the polarization direction changes is different for each microcrystal, causes the microcrack to grow and may break the piezoelectric body 601. Particularly, in the piezoelectric body 601 that is a thin film, the grown crack is likely to pass through the piezoelectric body 601 in a thickness direction. In a case where the crack passes through the piezoelectric body 601 in the thickness direction, an electrical short-circuit is generated between the first electrode 611 and the second electrode 612, and the function of the piezoelectric element 60 deteriorates.

The application of the reversed polarity electric field to the piezoelectric element 60 is allowed in a case where the reversed polarity electric field is a low electric field and is applied for a short time. However, in a case where the reversed polarity electric field is continuously applied to the piezoelectric element 60 for a long time, the function of the piezoelectric element 60 may likely deteriorate. Accordingly, in the sleep mode that continues for a long time, in a case where electric charges accumulated in the first electrode 611 due to a leakage current or the like are discharged, and the electric potential of the first electrode 611 of the piezoelectric element 60 becomes lower than the electric potential of the second electrode 612, the application of the reversed polarity electric field to the piezoelectric element 60 continues for a long time, and the function of the piezoelectric element 60 may deteriorate.

5 Configuration of Piezoelectric Element Control Circuit

As described above, in a case where the selection circuit 230 does not select the drive signal COM as the drive signal VOUT, electric charges are accumulated in the first electrode 611, and the electric potential of the first electrode 611 may become unstable. Consequently, an unintended difference in electric potential may occur in the piezoelectric element 60. In a case where an unintended difference in electric potential occurs in the piezoelectric element 60, the piezoelectric element 60 is unintentionally displaced.

In the liquid ejection apparatus 1 according to the embodiment, instability of the electric potential of the first electrode 611 can be reduced even in a case where the drive signal COM is not selected as the drive signal VOUT in the plurality of selection circuits 230 included in the piezoelectric element control circuit 220.

Figure 12:
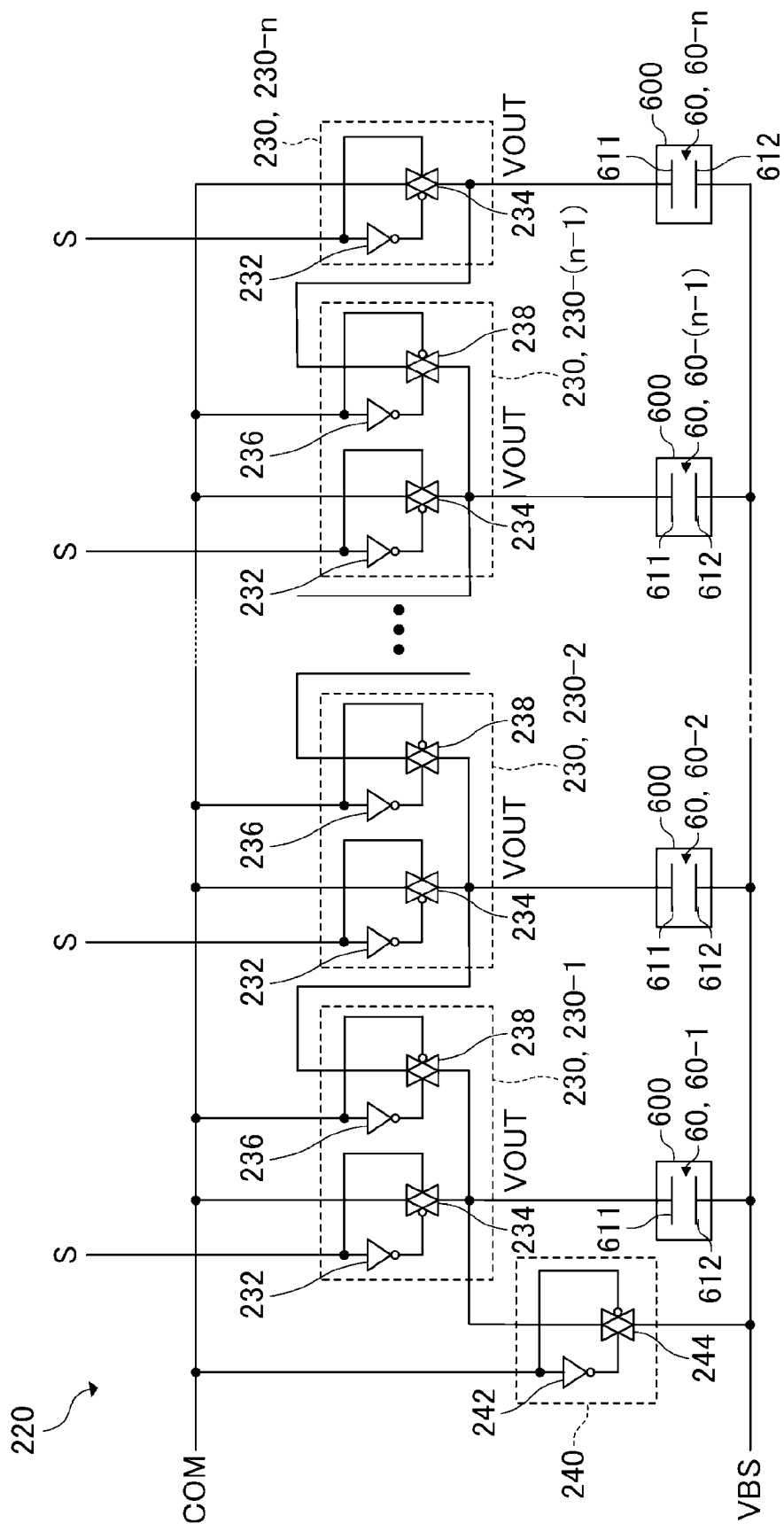
FIG. 12 is a circuit diagram illustrating an electrical configuration of a piezoelectric element control circuit.

FIG. 12 is a circuit diagram illustrating an electrical configuration of the piezoelectric element control circuit 220. As described above, the piezoelectric element control circuit 220 includes n selection circuits 230 and the switch circuit 240.

The selection circuit 230 includes an inverter 232 (NOT circuit) and a transfer gate 234. As described above, the selection circuit 230 disposed in the drive IC 80 is disposed in correspondence with each ejection unit 600 including the piezoelectric element 60. Accordingly, the inverter 232 (NOT circuit) and the transfer gate 234 are also disposed in correspondence with each ejection unit 600 including the piezoelectric element 60.

In FIG. 12, in the same manner as FIG. 8, among n selection circuits 230, the selection circuit 230-i (i is any of 1 to n) is supplied with the selection signal S that is output from the decoder 216 disposed in correspondence with the shift register 212 in the i-th stage. In addition, among n piezoelectric elements 60, the piezoelectric element 60-i (i is any of 1 to n) is supplied with the drive signal VOUT output from the selection circuit 230-i.

The selection signal S output by the decoder 216 is supplied to a positive control terminal that is not marked with a circle in the transfer gate 234. In addition, the selection signal S is logically inverted by the inverter 232 and is supplied to a negative control terminal that is marked with a circle in the transfer gate 234. In addition, the drive signal COM is supplied to an input terminal of the transfer gate 234, and the drive signal VOUT is supplied to the ejection unit 600 from an output terminal of the transfer gate 234.

In a case where the selection signal S at H level is supplied from the decoder 216, the input terminal and the output terminal of the transfer gate 234 are conducted. Accordingly, the drive signal COM is selected and output to the ejection unit 600 as the drive signal VOUT. In addition, in a case where the selection signal S at L level is supplied from the decoder 216, the input terminal and the output terminal of the transfer gate 234 are set to be in a non-conduction state. Accordingly, the drive signal COM is not selected as the drive signal VOUT.

In addition, the selection circuit 230-j (j is any of 1 to n−1) includes an inverter 236 (NOT circuit) and a transfer gate 238.

The drive signal COM is supplied to a negative control terminal that is marked with a circle in the transfer gate 238. In addition, the drive signal COM is logically inverted by the inverter 236 and is supplied to a positive control terminal that is not marked with a circle in the transfer gate 238. In addition, in the selection circuit 230-j, one input or output terminal of the transfer gate 238 is electrically connected to the first electrode 611 of the piezoelectric element 60-(j+1), and the other input or output terminal of the transfer gate 238 is electrically connected to the first electrode 611 of the piezoelectric element 60-j.

The selection circuit 230-n does not include the inverter 236 (NOT circuit) and the transfer gate 238.

The switch circuit 240 includes an inverter 242 (NOT circuit) and a transfer gate 244.

The drive signal COM is supplied to a negative control terminal that is marked with a circle in the transfer gate 244. In addition, the drive signal COM is logically inverted by the inverter 242 and is supplied to a positive control terminal that is not marked with a circle in the transfer gate 244. In addition, one input or output terminal of the transfer gate 244 is electrically connected to the first electrode 611 of the piezoelectric element 60-1, and the other input or output terminal of the transfer gate 244 is electrically connected to the second electrodes 612 of the piezoelectric elements 60-1 to 60-n.

The input and output terminals of each transfer gate 238 and the transfer gate 244 are conducted to each other in a case where the drive signal COM has an electric potential lower than a predetermined electric potential VT. The conduction between the input and output terminals of all transfer gates 238 electrically connects the first electrodes 611 of the piezoelectric elements 60-1 to 60-n to each other. In addition, the conduction between the input and output terminals of the transfer gate 244 electrically connects the first electrode 611 of the piezoelectric element 60-1 to the second electrodes 612 of the piezoelectric elements 60-1 to 60-n. That is, in a case where the drive signal COM has an electric potential lower than the predetermined electric potential VT, the first electrodes 611 and the second electrodes 612 of the piezoelectric elements 60-1 to 60-n are electrically connected.

The input and output terminals of each transfer gate 238 and the transfer gate 244 are set to be in the non-conduction state in a case where the drive signal COM has an electric potential higher than or equal to the predetermined electric potential VT. By setting the input and output terminals of all transfer gates 238 to be in the non-conduction state, the first electrodes 611 of the piezoelectric elements 60-1 to 60-n are electrically blocked from each other. In addition, by setting the input and output terminals of the transfer gate 244 to be in the non-conduction state, the first electrode 611 of the piezoelectric element 60-1 is electrically blocked from the second electrodes 612 of the piezoelectric elements 60-1 to 60-n. That is, in a case where the drive signal COM has an electric potential higher than or equal to the predetermined electric potential VT, the first electrode 611 of each piezoelectric element 60 is electrically blocked from the first electrodes 611 of all of the other piezoelectric elements 60 and the second electrodes 612 of all piezoelectric elements 60.

In the following description, the state where the input terminal and the output terminal of the transfer gate 234 are conducted will be referred to as an ON state of the transfer gate 234. Similarly, the state where the input and output terminals of the transfer gates 238 and 244 are conducted to each other will be referred to as an ON state of the transfer gates 238 and 244. In addition, the state where the input terminal and the output terminal of the transfer gate 234 are not conducted will be referred to as an OFF state of the transfer gate 234. Similarly, the state where the input and output terminals of the transfer gates 238 and 244 are not conducted to each other will be referred to as an OFF state of the transfer gates 238 and 244.

In the embodiment, the predetermined electric potential VT is set such that all transfer gates 238 and the transfer gate 244 are set to be in the OFF state in the printing mode. That is, logical threshold voltages of the transfer gate 238 and the transfer gate 244 are set such that the predetermined electric potential VT is an electric potential lower than the minimum electric potential of the drive signal COM (in the example in FIG. 7, the minimum electric potential of the voltage waveform Adp) in the printing mode. Accordingly, printing can be normally performed by the liquid ejection apparatus 1.

In addition, in the embodiment, the predetermined electric potential VT is set such that all transfer gates 238 and the transfer gate 244 are set to be in the ON state in the sleep mode. As described above, in the sleep mode, the electric potential of the drive signal COM starts decreasing to the ground electric potential. Accordingly, the logical threshold voltages of the transfer gate 238 and the transfer gate 244 are set such that the predetermined electric potential VT is an electric potential between an electric potential higher than the ground electric potential, for example, the voltage value (for example, DC 5 V) of the reference voltage signal VBS in the printing mode and the standby mode, and the ground electric potential. Accordingly, in the sleep mode, the difference in electric potential between the first electrode 611 and the second electrode 612 is almost equal to zero in all piezoelectric elements 60.

The electric potential of the first electrode 611 of the piezoelectric element 60 is controlled by the piezoelectric element control circuit 220. That is, the piezoelectric element control circuit 220 is a circuit that controls the piezoelectric element 60.

Figure 13:
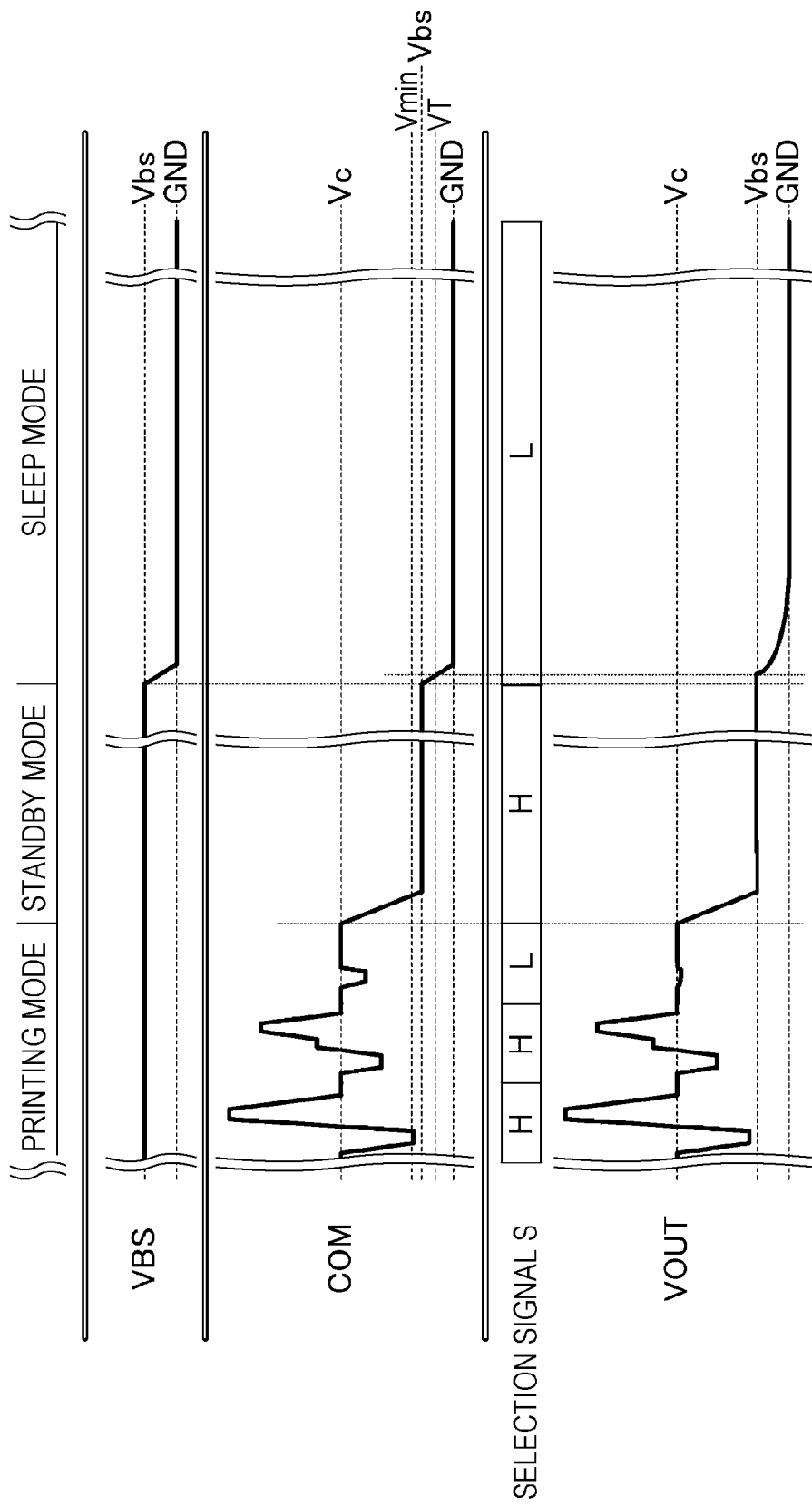
FIG. 13 is a diagram illustrating a relationship between the drive signal and a drive signal in a standby mode and a sleep mode.

One example of the operation of the selection circuit 230 will be described using FIG. 13. FIG. 13 is a diagram for describing a relationship among the reference voltage signal VBS, the drive signal COM, and the drive signal VOUT in the standby mode and the sleep mode. While FIG. 13 illustrates a case where the "large dot" is ejected as the drive signal VOUT in the printing mode before a transition to the standby mode, the same applies to cases where the drive signal VOUT corresponds to the "medium dot", the "small dot", and the "micro-vibration". In addition, FIG. 13 illustrates an electric potential Vbs of the reference voltage signal VBS in the printing mode and the standby mode, a minimum electric potential Vmin of the drive signal COM in the printing mode, and a ground electric potential GND.

In a case where the operation mode transitions to the standby mode from the printing mode, the drive signal COM is controlled to approach the voltage value of the reference voltage signal VBS. That is, in a case where a predetermined time elapses, the electric potential of the drive signal COM becomes equal to Vbs.

In the standby mode, the decoder 216 outputs the selection signal S at H level. Accordingly, all transfer gates 234 are set to be in the ON state, and the drive signal COM is supplied to the first electrodes 611 of all piezoelectric elements 60. Thus, the electric potential of the drive signal VOUT is equal to Vbs that is the same electric potential as the drive signal COM.

In a case where the operation mode transitions to the sleep mode, the electric potentials of the drive signal COM and the reference voltage signal VBS become equal to a ground electric potential GND.

In the sleep mode, each decoder 216 outputs the selection signal S at L level. Accordingly, all transfer gates 234 are set to be in the OFF state, and the supply of the drive signal COM to the first electrodes 611 of all piezoelectric elements 60 is blocked. However, in a case where the electric potential of the drive signal COM becomes lower than the predetermined electric potential VT, all transfer gates 238 and the transfer gate 244 are set to be in the ON state, and the electric potential of the drive signal VOUT, that is, the electric potential of the first electrode 611 of the piezoelectric element 60, is decreased to the ground electric potential GND. Accordingly, in the sleep mode that continues for a sufficiently long period with respect to the cycle Ta of the drive signal COM, a state where the difference in electric potential between the first electrode 611 and the second electrode 612 is almost equal to zero in all piezoelectric elements 60 is maintained. Thus, each piezoelectric element 60 is less likely to be unintentionally displaced.

The predetermined electric potential VT may be set such that all transfer gates 238 and the transfer gate 244 are set to be in the ON state in the standby mode. That is, the logical threshold voltages of the transfer gate 238 and the transfer gate 244 may be set such that the predetermined electric potential VT is an electric potential between the minimum electric potential Vmin of the drive signal COM in the printing mode and the electric potential Vbs of the reference voltage signal VBS in the printing mode and the standby mode. In this case, in the standby mode, the difference in electric potential between the first electrode 611 and the second electrode 612 of each piezoelectric element 60 is almost equal to zero. Thus, the electric potential of the first electrode 611 is equal to Vbs. In the standby mode, each decoder 216 outputs the selection signal S at H level. Thus, all transfer gates 234 are set to be in the ON state, and the first electrode 611 of each piezoelectric element 60 is supplied with the drive signal VOUT. However, there is no concern since the electric potential of the drive signal COM is equal to Vbs.

The piezoelectric element 60-1 and the piezoelectric element 60-2 are examples of a "first piezoelectric element" and a "second piezoelectric element" of the invention, respectively. In addition, the first electrode 611 and the second electrode 612 of the piezoelectric element 60-1 are examples of a "first electrode" and a "second electrode" of the invention, respectively. In addition, the first electrode 611 and the second electrode 612 of the piezoelectric element 60-2 are examples of a "third electrode" and a "fourth electrode" of the invention, respectively. In addition, a circuit including the inverter 232 and the transfer gate 234 of the selection circuit 230-1 is a circuit that switches between supplying and not supplying the drive signal COM to the first electrode 611 of the piezoelectric element 60-1, and is one example of a "first switch circuit" of the invention. In addition, the switch circuit 240 is one example of a "second switch circuit" of the invention. In addition, a circuit including the inverter 232 and the transfer gate 234 of the selection circuit 230-2 is a circuit that switches between supplying and not supplying the drive signal COM to the first electrode 611 of the piezoelectric element 60-2, and is one example of a "third switch circuit" of the invention. In addition, a circuit including the inverter 236 and the transfer gate 238 of the selection circuit 230-1 is a circuit that switches between electrically connecting and not electrically connecting the first electrode 611 of the piezoelectric element 60-1 to the first electrode 611 of the piezoelectric element 60-2 depending on the electric potential of the drive signal COM, and is one example of a "fourth switch circuit" of the invention.

6 Action and Effect

As described above, according to the liquid ejection apparatus 1 according to the embodiment, in the sleep mode, all transfer gates 238 and the transfer gate 244 are set to be in the ON state, and the first electrodes 611 and the second electrodes 612 of all piezoelectric elements 60 are electrically connected. Thus, the electric potential of the first electrode 611 of each piezoelectric element 60 less likely becomes unstable. Particularly, even in a case where the resistance component of each piezoelectric element is increased by disposing the nozzles 651 at a high density and becomes greater than the resistance component in a case where the transfer gate 234 is in the OFF state, the electric potential of the first electrode 611 of each piezoelectric element 60 less likely becomes unstable.

In addition, according to the liquid ejection apparatus 1 according to the embodiment, in the sleep mode, a state where the difference in electric potential between the first electrode 611 and the second electrode 612 of each piezoelectric element 60 is almost equal to zero is maintained. Thus, each piezoelectric element 60 is less likely to be unintentionally displaced, and a crack or the like less likely occurs in the vibration plate 621 that is displaced along with the piezoelectric element 60.

In addition, according to the liquid ejection apparatus 1 according to the embodiment, in the sleep mode, the electric potential of the first electrode 611 of each piezoelectric element 60 is maintained at the electric potential of the second electrode 612 or higher. Thus, a reversed polarity electric field is less likely to be applied to the piezoelectric element 60. Accordingly, even in a case where the piezoelectric element 60 is formed as a polycrystalline body and is subjected to the polarization process, a decrease or deterioration in piezoelectric characteristics caused by the reversed polarity electric field less likely occurs.

In the liquid ejection apparatus 1 according to the embodiment, in the printing mode, all transfer gates 238 and the transfer gate 244 are set to be in the OFF state, and the first electrode 611 and the second electrode 612 of each piezoelectric element 60 are electrically blocked. Thus, printing can be normally performed.

7 Modification Example

While the voltage waveforms Adp, Bdp, and Cdp are described as being consecutively included in the drive signal COM in the embodiment, the drive signal COM may not include the voltage waveform Cdp corresponding to the micro-vibration.

In addition, while the control unit 10 and the print head 20 are connected through one flexible cable 190 in the embodiment, the control unit 10 and the print head 20 may be connected through a plurality of cables. In addition, various signals may be wirelessly transmitted to the print head 20 from the control unit 10. That is, the control unit and the print head 20 may not be connected through a cable.

In addition, while the drive signal VOUT is generated in the printing mode by selecting a part or all of the waveforms of the drive signal COM in the embodiment, a generation method for the drive signal supplied to each piezoelectric element 60 is not limited thereto, and various methods can be applied. For example, the drive signal supplied to each piezoelectric element 60 may be generated by combining waveforms of a plurality of drive signals.

In addition, while a serial scan type (serial printing type) ink jet printer that performs printing on the medium P by moving the print head 20 is illustrated as the liquid ejection apparatus in the embodiment, the invention can also be applied to a line head type ink jet printer that performs printing on a printing medium without moving a head.

The invention includes substantially the same configuration as the configuration described in the embodiment (for example, a configuration having the same function, the same method, and the same result or a configuration having the same advantage and the same effect). The invention also includes a configuration acquired by replacing a non-substantial part of the configuration described in the embodiment. The invention also includes a configuration that accomplishes the same effect or achieves the same advantage as the configuration described in the embodiment. The invention also includes a configuration acquired by adding a known technology to the configuration described in the embodiment.

What is claimed is:

1. A print head comprising:
    a first piezoelectric element that includes a first electrode supplied with a drive signal and a second electrode supplied with a reference voltage signal and is displaced by a difference in electric potential between the first electrode and the second electrode;
    a cavity that is filled with a liquid ejected from a nozzle along with the displacement of the first piezoelectric element;
    a vibration plate that is disposed between the cavity and the first piezoelectric element;
    a first switch circuit that switches between supplying and not supplying the drive signal to the first electrode; and
    a second switch circuit that is connected in parallel with the first piezoelectric element and that switches between electrically connecting and not electrically connecting the first electrode to the second electrode depending on an electric potential of the drive signal.

2. The print head according to claim 1, further comprising:
    a second piezoelectric element that includes a third electrode supplied with the drive signal and a fourth electrode supplied with the reference voltage signal and is displaced by a difference in electric potential between the third electrode and the fourth electrode;
    a third switch circuit that switches between supplying and not supplying the drive signal to the third electrode; and
    a fourth switch circuit that switches between electrically connecting and not electrically connecting the first electrode and the third electrode depending on the electric potential of the drive signal.

3. The print head according to claim 1,
wherein the first piezoelectric element is formed as a polycrystalline body and is subjected to a polarization process.

4. The print head according to claim 1,
wherein the second switch circuit electrically connects the first electrode and the second electrode in a case where the drive signal has an electric potential lower than a predetermined electric potential.

5. The print head according to claim 1,
wherein a resistance component when the first switch circuit is in an OFF state is smaller than a resistance component of the first piezoelectric element.

6. A liquid ejection apparatus comprising:
a drive circuit that outputs a drive signal;
a first piezoelectric element that includes a first electrode supplied with the drive signal and a second electrode supplied with a reference voltage signal and is displaced by a difference in electric potential between the first electrode and the second electrode;
a cavity that is filled with a liquid ejected from a nozzle along with the displacement of the first piezoelectric element;
a vibration plate that is disposed between the cavity and the first piezoelectric element;
a first switch circuit that switches between supplying and not supplying the drive signal to the first electrode; and
a second switch circuit that is connected in parallel with the first piezoelectric element and that switches between electrically connecting and not electrically connecting the first electrode to the second electrode depending on an electric potential of the drive signal.

7. The liquid ejection apparatus according to claim 6, further comprising:
a second piezoelectric element that includes a third electrode supplied with the drive signal and a fourth electrode supplied with the reference voltage signal and is displaced by a difference in electric potential between the third electrode and the fourth electrode;
a third switch circuit that switches between supplying and not supplying the drive signal to the third electrode; and
a fourth switch circuit that switches between electrically connecting and not electrically connecting the first electrode and the third electrode depending on the electric potential of the drive signal.

8. The liquid ejection apparatus according to claim 6,
wherein the first piezoelectric element is formed as a polycrystalline body and is subjected to a polarization process.

9. The liquid ejection apparatus according to claim 6,
wherein the second switch circuit electrically connects the first electrode and the second electrode in a case where the drive signal has an electric potential lower than a predetermined electric potential.

10. The liquid ejection apparatus according to claim 6,
wherein a resistance component when the first switch circuit is in an OFF state is smaller than a resistance component of the first piezoelectric element.

11. A piezoelectric element control circuit controlling a first piezoelectric element of a print head including the first piezoelectric element that includes a first electrode supplied with a drive signal and a second electrode supplied with a reference voltage signal and is displaced by a difference in electric potential between the first electrode and the second electrode, a cavity that is filled with a liquid ejected from a nozzle along with the displacement of the first piezoelectric element, and a vibration plate that is disposed between the cavity and the first piezoelectric element, the piezoelectric element control circuit comprising:
a first switch circuit that switches between supplying and not supplying the drive signal to the first electrode; and
a second switch circuit that is connected in parallel with the first piezoelectric element and that switches between electrically connecting and not electrically connecting the first electrode to the second electrode depending on an electric potential of the drive signal.

12. The piezoelectric element control circuit according to claim 11,
wherein the print head includes a second piezoelectric element that includes a third electrode supplied with the drive signal and a fourth electrode supplied with the reference voltage signal and is displaced by a difference in electric potential between the third electrode and the fourth electrode, and
the piezoelectric element control circuit further comprises
a third switch circuit that switches between supplying and not supplying the drive signal to the third electrode, and
a fourth switch circuit that switches between electrically connecting and not electrically connecting the first electrode and the third electrode depending on the electric potential of the drive signal.

13. The piezoelectric element control circuit according to claim 11,
wherein the first piezoelectric element is formed as a polycrystalline body and is subjected to a polarization process.

14. The piezoelectric element control circuit according to claim 11,
wherein the second switch circuit electrically connects the first electrode and the second electrode in a case where the drive signal has an electric potential lower than a predetermined electric potential.

15. The piezoelectric element control circuit according to claim 11,
wherein a resistance component when the first switch circuit is in an OFF state is smaller than a resistance component of the first piezoelectric element.

* * * * *